US010879437B2

(12) United States Patent
Seo et al.

(10) Patent No.: US 10,879,437 B2
(45) Date of Patent: Dec. 29, 2020

(54) WAFER-LEVEL LIGHT EMITTING DIODE PACKAGE AND METHOD OF FABRICATING THE SAME

(71) Applicant: Seoul Semiconductor Co., Ltd., Gyeonggi-do (KR)

(72) Inventors: Won Cheol Seo, Ansan-si (KR); Dae Sung Cho, Ansan-si (KR)

(73) Assignee: SEOUL SEMICONDUCTOR CO., LTD., Ansan-si (KR)

( * ) Notice: Subject to any disclaimer, the term of this patent is extended or adjusted under 35 U.S.C. 154(b) by 0 days.

(21) Appl. No.: 16/101,287

(22) Filed: Aug. 10, 2018

(65) Prior Publication Data

US 2018/0351057 A1    Dec. 6, 2018

Related U.S. Application Data

(63) Continuation of application No. 15/389,413, filed on Dec. 22, 2016, now Pat. No. 10,069,048, which is a
(Continued)

(30) Foreign Application Priority Data

Sep. 24, 2010  (KR) .................. 10-2010-0092807
Sep. 24, 2010  (KR) .................. 10-2010-0092808

(51) Int. Cl.
*H01L 33/56*    (2010.01)
*H01L 33/42*    (2010.01)
(Continued)

(52) U.S. Cl.
CPC ............. *H01L 33/56* (2013.01); *H01L 27/15* (2013.01); *H01L 27/153* (2013.01);
(Continued)

(58) Field of Classification Search
CPC ......... H01L 33/08; H01L 33/10; H01L 33/20; H01L 33/22; H01L 33/385; H01L 33/387
See application file for complete search history.

(56) References Cited

U.S. PATENT DOCUMENTS 3,954,534 A    5/1976  Scifres et al.
3,974,514 A    8/1976  Kressel et al.
(Continued)

FOREIGN PATENT DOCUMENTS

CN    1332502 A    1/2002
CN    1497745 A    5/2004
(Continued)

OTHER PUBLICATIONS

US 7,282,743 B2, 10/2007, Sakai et al. (withdrawn)
(Continued)

*Primary Examiner* — Cuong Q Nguyen
(74) *Attorney, Agent, or Firm* — Perkins Coie LLP

(57) ABSTRACT

Exemplary embodiments of the present invention provide a wafer-level light emitting diode (LED) package and a method of fabricating the same. The LED package includes a semiconductor stack including a first conductive type semiconductor layer, an active layer, and a second conductive type semiconductor layer; a plurality of contact holes arranged in the second conductive type semiconductor layer and the active layer, the contact holes exposing the first conductive type semiconductor layer; a first bump arranged on a first side of the semiconductor stack, the first bump being electrically connected to the first conductive type semiconductor layer via the plurality of contact holes; a second bump arranged on the first side of the semiconductor stack, the second bump being electrically connected to the
(Continued)

second conductive type semiconductor layer; and a protective insulation layer covering a sidewall of the semiconductor stack.

42 Claims, 19 Drawing Sheets

Related U.S. Application Data continuation of application No. 15/041,907, filed on Feb. 11, 2016, now Pat. No. 9,543,490, which is a continuation of application No. 14/815,433, filed on Jul. 31, 2015, now Pat. No. 9,293,664, which is a continuation of application No. 14/708,029, filed on May 8, 2015, now Pat. No. 9,219,196, which is a continuation of application No. 13/194,317, filed on Jul. 29, 2011, now Pat. No. 9,070,851.

(51) Int. Cl.
　　*H01L 33/50* (2010.01)
　　*H01L 33/44* (2010.01)
　　*H01L 33/40* (2010.01)
　　*H01L 27/15* (2006.01)
　　*H01L 33/38* (2010.01)
　　*H01L 33/46* (2010.01)
　　*H01L 33/00* (2010.01)
　　*H01L 33/62* (2010.01)
　　*H01L 33/48* (2010.01)
　　*H01L 33/10* (2010.01)
　　*H01L 33/24* (2010.01)
　　*H01L 33/64* (2010.01)
　　*H01L 33/22* (2010.01)
　　*H01L 33/58* (2010.01)
　　*H01L 33/06* (2010.01)
　　*H01L 33/12* (2010.01)
　　*H01L 33/32* (2010.01)
　　*H01L 33/20* (2010.01)

(52) U.S. Cl.
　　CPC ........ *H01L 33/007* (2013.01); *H01L 33/0093* (2020.05); *H01L 33/0095* (2013.01); *H01L 33/06* (2013.01); *H01L 33/10* (2013.01); *H01L 33/12* (2013.01); *H01L 33/22* (2013.01); *H01L 33/24* (2013.01); *H01L 33/32* (2013.01); *H01L 33/38* (2013.01); *H01L 33/382* (2013.01); *H01L 33/385* (2013.01); *H01L 33/405* (2013.01); *H01L 33/42* (2013.01); *H01L 33/44* (2013.01); *H01L 33/46* (2013.01); *H01L 33/486* (2013.01); *H01L 33/50* (2013.01); *H01L 33/502* (2013.01); *H01L 33/505* (2013.01); *H01L 33/507* (2013.01); *H01L 33/58* (2013.01); *H01L 33/62* (2013.01); *H01L 33/642* (2013.01); *H01L 33/647* (2013.01); *H01L 33/20* (2013.01); *H01L 2924/0002* (2013.01); *H01L 2933/005* (2013.01); *H01L 2933/0016* (2013.01); *H01L 2933/0025* (2013.01); *H01L 2933/0033* (2013.01); *H01L 2933/0041* (2013.01); *H01L 2933/0066* (2013.01); *H01L 2933/0075* (2013.01)

(56) References Cited

U.S. PATENT DOCUMENTS

| | | |
|---|---|---|
| 4,329,625 A | 5/1982 | Nishizawa et al. |
| 4,499,655 A | 2/1985 | Anthony |
| 4,612,083 A | 9/1986 | Yasumoto et al. |
| 4,712,721 A | 12/1987 | Noel et al. |
| 4,774,632 A | 9/1988 | Neugebauer |
| 4,807,021 A | 2/1989 | Okumura |
| 4,824,767 A | 4/1989 | Chambers et al. |
| 4,978,639 A | 12/1990 | Hua et al. |
| 5,003,359 A | 3/1991 | Abeles |
| 5,016,138 A | 5/1991 | Woodman |
| 5,115,441 A | 5/1992 | Kopf et al. |
| 5,166,097 A | 11/1992 | Tanielian |
| 5,192,987 A | 3/1993 | Khan et al. |
| 5,212,115 A | 5/1993 | Cho et al. |
| 5,229,647 A | 7/1993 | Gnadinger |
| 5,256,596 A | 10/1993 | Ackley et al. |
| 5,260,169 A | 11/1993 | Nakano |
| 5,268,326 A | 12/1993 | Lesk et al. |
| 5,270,261 A | 12/1993 | Bertin et al. |
| 5,393,990 A | 2/1995 | Kohn |
| 5,394,010 A | 2/1995 | Tazawa et al. |
| 5,399,898 A | 3/1995 | Rostoker |
| 5,408,123 A | 4/1995 | Murai |
| 5,411,918 A | 5/1995 | Keible et al. |
| 5,414,281 A | 5/1995 | Watabe et al. |
| 5,419,806 A | 5/1995 | Huebner |
| 5,420,064 A | 5/1995 | Okonogi et al. |
| 5,463,280 A | 10/1995 | Johnson |
| 5,487,999 A | 1/1996 | Farnworth |
| 5,491,350 A | 2/1996 | Unno et al. |
| 5,528,057 A | 6/1996 | Yanagase et al. |
| 5,557,115 A | 9/1996 | Shakuda |
| 5,563,079 A | 10/1996 | Shin et al. |
| 5,587,342 A | 12/1996 | Lin et al. |
| 5,608,264 A | 3/1997 | Gaul |
| 5,618,752 A | 4/1997 | Gaul |
| 5,627,106 A | 5/1997 | Hsu |
| 5,646,067 A | 7/1997 | Gaul |
| 5,648,684 A | 7/1997 | Bertin et al. |
| 5,682,062 A | 10/1997 | Gaul |
| 5,696,389 A | 12/1997 | Ishikawa et al. |
| 5,712,175 A | 1/1998 | Yoshida |
| 5,744,828 A | 4/1998 | Nozaki et al. |
| 5,751,013 A | 5/1998 | Kidoguchi et al. |
| 5,756,395 A | 5/1998 | Rostoker et al. |
| 5,757,445 A | 5/1998 | Vu et al. |
| 5,767,001 A | 6/1998 | Bertagnolli et al. |
| 5,779,924 A | 7/1998 | Krames et al. |
| 5,793,062 A | 8/1998 | Kish et al. |
| 5,793,105 A | 8/1998 | Pace |
| 5,795,619 A | 8/1998 | Lin et al. |
| 5,798,537 A | 8/1998 | Nitta |
| 5,814,889 A | 9/1998 | Gaul |
| 5,846,879 A | 12/1998 | Winnerl et al. |
| 5,851,894 A | 12/1998 | Ramm |
| 5,886,401 A | 3/1999 | Liu |
| 5,898,185 A | 4/1999 | Bojarczuk et al. |
| 5,903,056 A | 5/1999 | Canning et al. |
| 5,930,596 A | 7/1999 | Klose et al. |
| 5,943,597 A | 8/1999 | Kleffner et al. |
| 5,959,316 A | 9/1999 | Lowery |
| 5,973,396 A | 10/1999 | Farnworth |
| 5,976,769 A | 11/1999 | Chapman |
| 5,986,324 A | 11/1999 | Adlerstein et al. |
| 5,998,232 A | 12/1999 | Maruska |
| 6,004,881 A | 12/1999 | Bozada et al. |
| 6,018,167 A | 1/2000 | Oota |
| 6,046,464 A | 4/2000 | Schetzina |
| 6,066,861 A | 5/2000 | Hoehn et al. |
| RE36,747 E | 6/2000 | Manabe et al. |
| 6,071,780 A | 6/2000 | Okamoto et al. |
| 6,075,710 A | 6/2000 | Lau |
| 6,091,085 A | 7/2000 | Lester |
| 6,114,716 A | 9/2000 | Boles et al. |
| 6,150,197 A | 11/2000 | Boles et al. |
| 6,153,503 A | 11/2000 | Lin et al. |
| 6,177,685 B1 | 1/2001 | Teraguchi et al. |
| 6,185,241 B1 | 2/2001 | Sun |
| 6,194,743 B1 | 2/2001 | Kondoh et al. |
| 6,197,609 B1 | 3/2001 | Tsutsui et al. |
| 6,208,680 B1 | 3/2001 | Chirovsky et al. |

(56) References Cited

U.S. PATENT DOCUMENTS

| | | |
|---|---|---|
| 6,222,207 B1 | 4/2001 | Carter-coman et al. |
| 6,268,114 B1 | 7/2001 | Wen et al. |
| 6,274,924 B1 | 8/2001 | Carey et al. |
| 6,278,136 B1 | 8/2001 | Nitta |
| 6,307,218 B1 | 10/2001 | Steigerwald et al. |
| 6,316,820 B1 | 11/2001 | Schmitz et al. |
| 6,326,701 B1 | 12/2001 | Shinogi et al. |
| 6,331,450 B1 | 12/2001 | Uemura |
| 6,345,902 B2 | 2/2002 | Ohkohdo et al. |
| 6,362,069 B1 | 3/2002 | Forrest et al. |
| 6,369,448 B1 | 4/2002 | McCormick |
| 6,375,340 B1 | 4/2002 | Biebl et al. |
| 6,407,448 B2 | 6/2002 | Chun |
| 6,410,942 B1 | 6/2002 | Thibeault et al. |
| 6,424,031 B1 | 7/2002 | Glenn |
| 6,440,836 B1 | 8/2002 | Lu et al. |
| 6,451,875 B1 | 9/2002 | Suga et al. |
| 6,462,358 B1 | 10/2002 | Lin et al. |
| 6,463,088 B1 | 10/2002 | Baillargeon et al. |
| 6,468,821 B2 | 10/2002 | Maeda et al. |
| 6,469,393 B2 | 10/2002 | Oya |
| 6,472,688 B2 | 10/2002 | Miyata |
| 6,472,718 B2 | 10/2002 | Lell |
| 6,480,389 B1 | 11/2002 | Shie et al. |
| 6,486,499 B1 | 11/2002 | Krames et al. |
| 6,489,637 B1 | 12/2002 | Sakamoto et al. |
| 6,495,862 B1 | 12/2002 | Okazaki et al. |
| 6,504,301 B1 | 1/2003 | Lowery |
| 6,514,782 B1 | 2/2003 | Wierer et al. |
| 6,517,218 B2 | 2/2003 | Hochstein |
| 6,518,079 B2 | 2/2003 | Imler |
| 6,518,598 B1 | 2/2003 | Chen |
| 6,518,665 B1 | 2/2003 | Westby et al. |
| 6,521,914 B2 | 2/2003 | Krames et al. |
| 6,547,249 B2 | 4/2003 | Collins et al. |
| 6,555,917 B1 | 4/2003 | Heo |
| 6,562,643 B2 | 5/2003 | Chen |
| 6,573,537 B1 | 6/2003 | Steigerwald et al. |
| 6,576,488 B2 | 6/2003 | Collins et al. |
| 6,580,096 B2 | 6/2003 | Chen et al. |
| 6,580,152 B2 | 6/2003 | Hasegawa |
| 6,593,160 B2 | 7/2003 | Carter-Coman et al. |
| 6,614,172 B2 | 9/2003 | Chiu et al. |
| 6,630,689 B2 | 10/2003 | Bhat et al. |
| 6,630,691 B1 | 10/2003 | Mueller-Mach et al. |
| 6,635,508 B2 | 10/2003 | Arai et al. |
| 6,635,902 B1 | 10/2003 | Lin |
| 6,638,792 B2 | 10/2003 | Hui et al. |
| 6,642,072 B2 | 11/2003 | Inoue et al. |
| 6,642,618 B2 | 11/2003 | Yagi et al. |
| 6,642,652 B2 | 11/2003 | Collins et al. |
| 6,653,216 B1 | 11/2003 | Shimomaki et al. |
| 6,656,828 B1 | 12/2003 | Maitani et al. |
| 6,657,236 B1 | 12/2003 | Thibeault et al. |
| 6,658,040 B1 | 12/2003 | Hu et al. |
| 6,661,029 B1 | 12/2003 | Duggal |
| 6,686,676 B2 | 2/2004 | Mcnulty et al. |
| 6,693,306 B2 | 2/2004 | Chen et al. |
| 6,696,703 B2 | 2/2004 | Mueller-mach et al. |
| 6,730,940 B1 | 5/2004 | Steranka et al. |
| 6,740,906 B2 | 5/2004 | Slater et al. |
| 6,741,029 B2 | 5/2004 | Matsubara et al. |
| 6,751,245 B1 | 6/2004 | Wasserbauer et al. |
| 6,753,599 B2 | 6/2004 | Kim |
| 6,756,731 B1 | 6/2004 | Sano |
| 6,759,752 B2 | 7/2004 | Camenforte et al. |
| 6,768,190 B2 | 7/2004 | Yang et al. |
| 6,775,310 B2 | 8/2004 | Sai et al. |
| 6,791,119 B2 | 9/2004 | Slater et al. |
| 6,791,259 B1 | 9/2004 | Stokes et al. |
| 6,798,806 B1 | 9/2004 | Johnson et al. |
| 6,800,500 B2 | 10/2004 | Coman et al. |
| 6,812,502 B1 | 11/2004 | Chien et al. |
| 6,815,254 B2 | 11/2004 | Mistry et al. |
| 6,818,532 B2 | 11/2004 | Yeom et al. |
| 6,818,545 B2 | 11/2004 | Lee et al. |
| 6,822,993 B2 | 11/2004 | Lee et al. |
| 6,828,596 B2 | 12/2004 | Steigerwald et al. |
| 6,828,665 B2 | 12/2004 | Pu et al. |
| 6,833,564 B2 | 12/2004 | Shen et al. |
| 6,838,702 B1 | 1/2005 | Ho |
| 6,849,472 B2 | 2/2005 | Krames et al. |
| 6,852,558 B2 | 2/2005 | Lee et al. |
| 6,858,880 B2 | 2/2005 | Horiuchi et al. |
| 6,861,761 B2 | 3/2005 | Yang et al. |
| 6,867,505 B2 | 3/2005 | Lee et al. |
| 6,869,812 B1 | 3/2005 | Liu |
| 6,870,311 B2 | 3/2005 | Mueller et al. |
| 6,871,982 B2 | 3/2005 | Holman et al. |
| 6,876,008 B2 | 4/2005 | Bhat et al. |
| 6,885,035 B2 | 4/2005 | Bhat et al. |
| 6,885,690 B2 | 4/2005 | Aggerstam et al. |
| 6,888,171 B2 | 5/2005 | Liu et al. |
| 6,891,197 B2 | 5/2005 | Bhat et al. |
| 6,906,416 B2 | 6/2005 | Kamezos |
| 6,917,057 B2 | 7/2005 | Stokes et al. |
| 6,924,160 B2 | 8/2005 | Wei et al. |
| 6,924,437 B1 | 8/2005 | Creekmore et al. |
| 6,924,514 B2 | 8/2005 | Suenaga |
| 6,943,433 B2 | 9/2005 | Kamada |
| 6,946,309 B2 | 9/2005 | Camras et al. |
| 6,949,771 B2 | 9/2005 | Yoganandan et al. |
| 6,953,255 B2 | 10/2005 | Horiuchi et al. |
| 6,953,952 B2 | 10/2005 | Asakawa |
| 6,956,245 B2 | 10/2005 | Senda et al. |
| 6,957,899 B2 | 10/2005 | Jiang et al. |
| 6,959,856 B2 | 11/2005 | Oh et al. |
| 6,960,485 B2 | 11/2005 | Uemura et al. |
| 6,964,877 B2 | 11/2005 | Chen et al. |
| 6,969,626 B2 | 11/2005 | Guo et al. |
| 6,969,946 B2 | 11/2005 | Steranka et al. |
| 6,972,438 B2 | 12/2005 | Li et al. |
| 6,977,396 B2 | 12/2005 | Shen et al. |
| 6,995,401 B2 | 2/2006 | Yamada et al. |
| 6,995,402 B2 | 2/2006 | Ludowise et al. |
| 6,995,474 B1 | 2/2006 | Ho et al. |
| 7,005,324 B2 | 2/2006 | Imai |
| 7,005,679 B2 | 2/2006 | Tarsa et al. |
| 7,009,199 B2 | 3/2006 | Hall |
| 7,023,022 B2 | 4/2006 | Eliashevich et al. |
| 7,026,181 B2 | 4/2006 | Guo et al. |
| 7,026,659 B2 | 4/2006 | Slater et al. |
| 7,026,709 B2 | 4/2006 | Tsai et al. |
| 7,034,340 B2 | 4/2006 | Yukimoto |
| 7,045,828 B2 | 5/2006 | Shimizu et al. |
| 7,048,361 B2 | 5/2006 | Schmachtenberg et al. |
| 7,049,635 B2 | 5/2006 | Sano et al. |
| 7,054,345 B2 | 5/2006 | Ryou et al. |
| 7,067,361 B2 | 6/2006 | Allen et al. |
| 7,067,849 B2 | 6/2006 | Yoo |
| 7,078,252 B2 | 7/2006 | Uemura |
| 7,080,932 B2 | 7/2006 | Keuper |
| 7,095,061 B2 | 8/2006 | Steigerwald et al. |
| 7,105,860 B2 | 9/2006 | Shei et al. |
| 7,115,998 B2 | 10/2006 | Hiatt et al. |
| 7,119,003 B2 | 10/2006 | Bernier et al. |
| 7,119,422 B2 | 10/2006 | Chin |
| 7,125,734 B2 | 10/2006 | Sackrison et al. |
| 7,132,691 B1 | 11/2006 | Tanabe et al. |
| 7,138,660 B2 | 11/2006 | Ota et al. |
| 7,141,825 B2 | 11/2006 | Horio et al. |
| 7,148,517 B2 | 12/2006 | Tu et al. |
| 7,154,125 B2 | 12/2006 | Koide et al. |
| 7,157,294 B2 | 1/2007 | Uemura et al. |
| 7,157,746 B2 | 1/2007 | Ota et al. |
| 7,170,111 B2 | 1/2007 | Saxler |
| 7,170,151 B2 | 1/2007 | Elpedes et al. |
| 7,173,277 B2 | 2/2007 | Tamura et al. |
| 7,179,670 B2 | 2/2007 | Shelton et al. |
| 7,183,586 B2 | 2/2007 | Ichihara et al. |
| 7,186,302 B2 | 3/2007 | Chakraborty et al. |
| 7,186,580 B2 | 3/2007 | Tran et al. |
| 7,190,005 B2 | 3/2007 | Gibb et al. |
| 7,208,772 B2 | 4/2007 | Lee et al. |

(56) References Cited

U.S. PATENT DOCUMENTS

| | | |
|---|---|---|
| 7,210,819 B2 | 5/2007 | Jiang et al. |
| 7,211,832 B2 | 5/2007 | Hirose |
| 7,213,942 B2 | 5/2007 | Jiang et al. |
| 7,217,583 B2 | 5/2007 | Negley et al. |
| 7,221,044 B2 | 5/2007 | Fan et al. |
| 7,265,374 B2 | 9/2007 | Lee et al. |
| 7,271,421 B2 | 9/2007 | Yukimoto et al. |
| 7,276,739 B2 | 10/2007 | Chen et al. |
| 7,279,350 B2 | 10/2007 | Wu et al. |
| 7,279,783 B1 | 10/2007 | Fjelstad et al. |
| 7,285,801 B2 | 10/2007 | Eliashevich et al. |
| 7,285,850 B2 | 10/2007 | Poo et al. |
| 7,298,033 B2 | 11/2007 | Yoo |
| 7,310,458 B2 | 12/2007 | Wehrly |
| 7,317,211 B2 | 1/2008 | Watanabe et al. |
| 7,321,161 B2 | 1/2008 | Teixeira et al. |
| 7,335,517 B2 | 2/2008 | Hayasaka et al. |
| 7,335,920 B2 | 2/2008 | Denbaars et al. |
| 7,338,169 B2 | 3/2008 | Somani |
| 7,342,357 B2 | 3/2008 | Sakano et al. |
| 7,348,212 B2 | 3/2008 | Schiaffino et al. |
| 7,355,274 B2 | 4/2008 | Lim |
| 7,361,938 B2 | 4/2008 | Mueller et al. |
| 7,361,940 B2 | 4/2008 | Kim et al. |
| 7,364,982 B2 | 4/2008 | Furukawa et al. |
| 7,365,374 B2 | 4/2008 | Piner et al. |
| 7,365,427 B2 | 4/2008 | Lu et al. |
| 7,372,082 B2 | 5/2008 | Kim et al. |
| 7,375,380 B2 | 5/2008 | Asahara et al. |
| 7,391,105 B2 | 6/2008 | Yeom |
| 7,391,153 B2 | 6/2008 | Suehiro et al. |
| 7,405,433 B2 | 7/2008 | Chew |
| 7,413,918 B2 | 8/2008 | Tran et al. |
| 7,417,259 B2 | 8/2008 | Sakai et al. |
| 7,419,894 B2 | 9/2008 | Makiyama et al. |
| 7,420,814 B2 | 9/2008 | Kim et al. |
| 7,432,142 B2 | 10/2008 | Saxler et al. |
| 7,436,000 B2 | 10/2008 | Kim et al. |
| 7,439,166 B1 | 10/2008 | Milosavljevic et al. |
| 7,446,028 B2 | 11/2008 | Hiatt et al. |
| 7,446,341 B2 | 11/2008 | Bader et al. |
| 7,456,035 B2 | 11/2008 | Eliashevich et al. |
| 7,456,495 B2 | 11/2008 | Pohl et al. |
| 7,470,938 B2 | 12/2008 | Lee et al. |
| 7,473,934 B2 | 1/2009 | Nagai et al. |
| 7,474,681 B2 | 1/2009 | Lin et al. |
| 7,486,867 B2 | 2/2009 | Wang |
| 7,488,988 B2 | 2/2009 | Lin et al. |
| 7,488,989 B2 | 2/2009 | Nitta et al. |
| 7,489,086 B2 | 2/2009 | Miskin et al. |
| 7,491,976 B2 | 2/2009 | Takeuchi et al. |
| 7,501,662 B2 | 3/2009 | Sonobe et al. |
| 7,511,311 B2 | 3/2009 | Kususe et al. |
| 7,524,686 B2 | 4/2009 | Chu et al. |
| 7,525,248 B1 | 4/2009 | Fan |
| 7,530,712 B2 | 5/2009 | Lin et al. |
| 7,531,843 B2 | 5/2009 | Lin et al. |
| 7,535,028 B2 | 5/2009 | Fan et al. |
| 7,544,524 B2 | 6/2009 | Lin et al. |
| 7,554,126 B2 | 6/2009 | Higashi et al. |
| 7,557,443 B2 | 7/2009 | Ye et al. |
| 7,564,887 B2 | 7/2009 | Wang et al. |
| 7,566,639 B2 | 7/2009 | Kohda |
| 7,566,910 B2 | 7/2009 | Kim et al. |
| 7,573,074 B2 | 8/2009 | Shum et al. |
| 7,589,355 B2 | 9/2009 | Tomoda et al. |
| 7,589,408 B2 | 9/2009 | Weng et al. |
| 7,592,194 B2 | 9/2009 | Jonda et al. |
| 7,592,633 B2 | 9/2009 | Shakuda |
| 7,592,637 B2 | 9/2009 | Zimmerman et al. |
| 7,601,989 B2 | 10/2009 | Epler et al. |
| 7,608,921 B2 | 10/2009 | Pendse |
| 7,622,746 B1 | 11/2009 | Lester et al. |
| 7,626,210 B2 | 12/2009 | Shchekin et al. |
| 7,626,211 B2 | 12/2009 | Sugiura et al. |
| 7,635,643 B2 | 12/2009 | Daubenspeck et al. |
| 7,635,874 B2 | 12/2009 | Miller et al. |
| 7,645,688 B2 | 1/2010 | Lee et al. |
| 7,646,036 B2 | 1/2010 | Kozawa et al. |
| 7,648,849 B2 | 1/2010 | Lee et al. |
| 7,652,298 B2 | 1/2010 | Chen et al. |
| 7,652,304 B2 | 1/2010 | Steigerwald et al. |
| 7,671,374 B2 | 3/2010 | Wang et al. |
| 7,705,370 B2 | 4/2010 | Fitzgerald |
| 7,709,282 B2 | 5/2010 | Fukshima et al. |
| 7,709,849 B1 | 5/2010 | Kal et al. |
| 7,714,342 B2 | 5/2010 | Lee et al. |
| 7,714,348 B2 | 5/2010 | Fan et al. |
| 7,719,120 B2 | 5/2010 | Hiatt et al. |
| 7,723,735 B2 | 5/2010 | Matsuda |
| 7,723,736 B2 | 5/2010 | Lee et al. |
| 7,732,825 B2 | 6/2010 | Kim et al. |
| 7,750,469 B2 | 7/2010 | Cho et al. |
| 7,750,485 B2 | 7/2010 | Takahashi et al. |
| 7,759,804 B2 | 7/2010 | Kanaoka et al. |
| 7,763,900 B2 | 7/2010 | Lee |
| 7,768,020 B2 | 8/2010 | Kim et al. |
| 7,786,498 B2 | 8/2010 | Choi et al. |
| 7,791,103 B2 | 9/2010 | Oshima |
| 7,795,623 B2 | 9/2010 | Emerson et al. |
| 7,824,937 B2 | 11/2010 | Suehiro et al. |
| 7,834,364 B2 | 11/2010 | Lee |
| 7,838,315 B2 | 11/2010 | Yang et al. |
| 7,838,891 B2 | 11/2010 | Lee et al. |
| 7,842,959 B2 | 11/2010 | Lee et al. |
| 7,843,074 B2 | 11/2010 | Gao et al. |
| 7,846,755 B2 | 12/2010 | Kal et al. |
| 7,868,343 B2 | 1/2011 | Negley et al. |
| 7,868,354 B2 | 1/2011 | Garcia et al. |
| 7,880,181 B2 | 2/2011 | Yoon et al. |
| 7,893,547 B2 | 2/2011 | Huang et al. |
| 7,902,572 B2 | 3/2011 | Ahn et al. |
| 7,906,788 B2 | 3/2011 | Nagai |
| 7,923,198 B2 | 4/2011 | Sawada |
| 7,943,286 B2 | 5/2011 | Xu et al. |
| 7,951,625 B2 | 5/2011 | Kamei |
| 7,968,897 B2 | 6/2011 | Hata et al. |
| 7,998,761 B2 | 8/2011 | Kim et al. |
| 7,999,271 B2 | 8/2011 | Kim et al. |
| 8,021,904 B2 | 9/2011 | Chitnis |
| 8,049,330 B2 | 11/2011 | Tain et al. |
| 8,076,212 B2 | 12/2011 | Takahashi et al. |
| 8,076,680 B2 | 12/2011 | Lee et al. |
| 8,097,937 B2 | 1/2012 | Bogner et al. |
| 8,118,451 B2 | 2/2012 | Householder et al. |
| 8,129,917 B2 | 3/2012 | Kim et al. |
| 8,148,905 B2 | 4/2012 | Miskin et al. |
| 8,149,509 B2 | 4/2012 | Howes |
| 8,159,000 B2 | 4/2012 | Lee et al. |
| 8,163,582 B2 | 4/2012 | Zimmerman et al. |
| 8,179,938 B2 | 5/2012 | Kim |
| 8,183,072 B2 | 5/2012 | Seo et al. |
| 8,183,691 B2 | 5/2012 | Kanaoka et al. |
| 8,188,488 B2 | 5/2012 | Andrews et al. |
| 8,207,543 B2 | 6/2012 | Hasnain |
| 8,211,724 B2 | 7/2012 | Kim et al. |
| 8,222,672 B2 | 7/2012 | Kanamura et al. |
| 8,227,272 B2 | 7/2012 | Lee et al. |
| 8,237,173 B2 | 8/2012 | Nagai |
| 8,268,715 B2 | 9/2012 | Hiatt et al. |
| 8,269,228 B2 | 9/2012 | Lee et al. |
| 8,269,238 B2 | 9/2012 | Kim et al. |
| 8,288,781 B2 | 10/2012 | Seo et al. |
| 8,299,476 B2 | 10/2012 | Lee et al. |
| 8,319,246 B2 | 11/2012 | Sugizaki |
| 8,334,091 B2 | 12/2012 | Nozaki et al. |
| 8,334,155 B2 | 12/2012 | Krames et al. |
| 8,337,071 B2 | 12/2012 | Negley et al. |
| 8,338,844 B2 | 12/2012 | Katsuno et al. |
| 8,350,279 B2 | 1/2013 | Lee et al. |
| 8,368,100 B2 * | 2/2013 | Donofrio ............. H01L 33/42 |
| | | 257/98 |
| 8,368,190 B2 | 2/2013 | Lee et al. |
| 8,445,933 B2 | 5/2013 | Lee et al. |

(56) References Cited

U.S. PATENT DOCUMENTS

| | | |
|---|---|---|
| 8,450,751 B2 | 5/2013 | Engl et al. |
| 8,476,648 B2 | 7/2013 | Lee et al. |
| 8,536,612 B2 | 9/2013 | Lee et al. |
| 8,581,291 B2 | 11/2013 | Shimokawa et al. |
| 8,643,029 B2 | 2/2014 | Lee et al. |
| 8,648,369 B2 | 2/2014 | Seo et al. |
| 8,716,727 B2 | 5/2014 | Lee et al. |
| 8,809,893 B2 | 8/2014 | Choi |
| 8,821,961 B2 | 9/2014 | Bondoux et al. |
| 8,835,937 B2 | 9/2014 | Wirth et al. |
| 8,846,521 B2 | 9/2014 | Sugizaki |
| 8,847,254 B2 | 9/2014 | Roth et al. |
| 8,847,266 B2 | 9/2014 | Choi et al. |
| 8,878,245 B2 | 11/2014 | Parikh et al. |
| 8,896,011 B2 | 11/2014 | Yoon et al. |
| 8,928,052 B2 | 1/2015 | Engl et al. |
| 8,937,326 B2 | 1/2015 | Lee et al. |
| 8,964,020 B2 | 2/2015 | Hersee |
| 8,981,395 B2 | 3/2015 | Choi |
| 9,070,851 B2 | 6/2015 | Seo et al. |
| 9,219,196 B2 | 12/2015 | Seo et al. |
| 9,293,664 B2 | 3/2016 | Seo et al. |
| 9,543,490 B2 | 1/2017 | Seo et al. |
| 10,069,048 B2 | 9/2018 | Seo et al. |
| 2002/0040982 A1 | 4/2002 | Uemura |
| 2002/0063258 A1 | 5/2002 | Motoki |
| 2002/0068373 A1 | 6/2002 | Lo et al. |
| 2002/0070387 A1 | 6/2002 | Wang et al. |
| 2003/0010989 A1 | 1/2003 | Yukimoto |
| 2003/0025212 A1 | 2/2003 | Bhat et al. |
| 2003/0067082 A1 | 4/2003 | Moshayedi |
| 2003/0222270 A1 | 12/2003 | Uemura |
| 2003/0230606 A1 | 12/2003 | Devinie |
| 2004/0012958 A1 | 1/2004 | Hashimoto et al. |
| 2004/0026708 A1 | 2/2004 | Chen |
| 2004/0206970 A1 | 10/2004 | Martin |
| 2004/0211972 A1 | 10/2004 | Du et al. |
| 2005/0001225 A1 | 1/2005 | Yoshimura et al. |
| 2005/0006659 A1 | 1/2005 | Ng et al. |
| 2005/0056855 A1 | 3/2005 | Lin et al. |
| 2005/0077531 A1 | 4/2005 | Kim |
| 2005/0104225 A1 | 5/2005 | Huang |
| 2005/0110032 A1 | 5/2005 | Saito et al. |
| 2005/0194605 A1 | 9/2005 | Shelton et al. |
| 2005/0208751 A1 | 9/2005 | Oh et al. |
| 2005/0248259 A1 | 11/2005 | Chang |
| 2005/0274970 A1 | 12/2005 | Ludowise |
| 2006/0001035 A1 | 1/2006 | Suehiro et al. |
| 2006/0043433 A1 | 3/2006 | Matsushita |
| 2006/0081858 A1 | 4/2006 | Lin et al. |
| 2006/0081869 A1 | 4/2006 | Lu et al. |
| 2006/0115927 A1 | 6/2006 | Yeo et al. |
| 2006/0131599 A1 | 6/2006 | Slater et al. |
| 2006/0138443 A1 | 6/2006 | Fan et al. |
| 2006/0183625 A1 | 8/2006 | Miyahara |
| 2006/0202225 A1 | 9/2006 | Kim et al. |
| 2006/0202272 A1 | 9/2006 | Wu et al. |
| 2006/0214173 A1 | 9/2006 | Beeson et al. |
| 2007/0114563 A1 | 5/2007 | Paek et al. |
| 2007/0145392 A1 | 6/2007 | Haberern et al. |
| 2007/0257901 A1 | 11/2007 | Gotou et al. |
| 2007/0284598 A1 | 12/2007 | Shakuda et al. |
| 2008/0029761 A1 | 2/2008 | Peng |
| 2008/0087902 A1 | 4/2008 | Lee et al. |
| 2008/0090329 A1 | 4/2008 | Wehrly |
| 2008/0099890 A1 | 5/2008 | Chen et al. |
| 2008/0111224 A1 | 5/2008 | Byun et al. |
| 2008/0179602 A1 | 7/2008 | Negley et al. |
| 2008/0182369 A1 | 7/2008 | Jeong et al. |
| 2008/0261340 A1 | 10/2008 | Matsuo et al. |
| 2008/0290364 A1 | 11/2008 | Kamiya et al. |
| 2009/0039359 A1 | 2/2009 | Yoon et al. |
| 2009/0050907 A1 | 2/2009 | Yuan et al. |
| 2009/0085048 A1 | 4/2009 | Lee et al. |
| 2009/0140272 A1 | 6/2009 | Beeson et al. |
| 2009/0140279 A1 | 6/2009 | Zimmerman et al. |
| 2009/0152740 A1 | 6/2009 | Park et al. |
| 2009/0267085 A1 | 10/2009 | Lee et al. |
| 2009/0283787 A1 | 11/2009 | Donofrio et al. |
| 2010/0059785 A1 | 3/2010 | Lin et al. |
| 2010/0078656 A1 | 4/2010 | Seo et al. |
| 2010/0117111 A1 | 5/2010 | Illek et al. |
| 2010/0117188 A1 | 5/2010 | Waldrab et al. |
| 2010/0127397 A1 | 5/2010 | Chen et al. |
| 2010/0148190 A1 | 6/2010 | Kim et al. |
| 2010/0148198 A1 | 6/2010 | Sugizaki et al. |
| 2010/0155941 A1 | 6/2010 | Matsuki et al. |
| 2010/0163887 A1 | 7/2010 | Kim et al. |
| 2010/0163900 A1 | 7/2010 | Seo et al. |
| 2010/0176405 A1 | 7/2010 | Villard |
| 2010/0210046 A1* | 8/2010 | Kao ............... H01L 33/385 438/26 |
| 2010/0244060 A1 | 9/2010 | Lee et al. |
| 2011/0049537 A1* | 3/2011 | Lee ............... H01L 33/382 257/88 |
| 2011/0084294 A1 | 4/2011 | Yao |
| 2011/0101414 A1 | 5/2011 | Thompson et al. |
| 2011/0140135 A1 | 6/2011 | Lee et al. |
| 2011/0169040 A1 | 7/2011 | Seo et al. |
| 2011/0175129 A1 | 7/2011 | Lee et al. |
| 2011/0220931 A1 | 9/2011 | Kojima |
| 2011/0260184 A1 | 10/2011 | Furuyama |
| 2011/0297965 A1* | 12/2011 | Akimoto ............ H01L 33/40 257/79 |
| 2012/0025214 A1 | 2/2012 | Ruan et al. |
| 2012/0032218 A1 | 2/2012 | Choi et al. |
| 2012/0074441 A1 | 3/2012 | Seo et al. |
| 2012/0267662 A1* | 10/2012 | Maute ............... H01L 33/20 257/98 |
| 2012/0286240 A1 | 11/2012 | Yu et al. |
| 2013/0099141 A1 | 4/2013 | Chua |
| 2013/0234173 A1 | 9/2013 | Lee et al. |
| 2014/0103289 A1 | 4/2014 | Liao et al. |
| 2015/0243844 A1 | 8/2015 | Seo et al. |
| 2015/0340579 A1 | 11/2015 | Seo et al. |
| 2016/0064598 A1 | 3/2016 | Choi et al. |
| 2016/0079471 A1 | 3/2016 | Liao et al. |
| 2016/0163941 A1 | 6/2016 | Seo et al. |
| 2016/0240721 A1 | 8/2016 | Chu et al. |
| 2016/0254414 A1 | 9/2016 | Jung et al. |
| 2016/0268478 A1 | 9/2016 | Tomizawa et al. |
| 2017/0104139 A1 | 4/2017 | Seo et al. |
| 2017/0365739 A1 | 12/2017 | Park et al. |
| 2018/0277719 A1 | 9/2018 | Lee |

FOREIGN PATENT DOCUMENTS

| | | |
|---|---|---|
| CN | 1734797 | 2/2006 |
| CN | 1947222 A | 4/2007 |
| CN | 101026212 A | 8/2007 |
| CN | 101752399 | 6/2010 |
| CN | 101764183 A | 6/2010 |
| CN | 101937962 A | 1/2011 |
| CN | 102132424 A | 7/2011 |
| JP | 118414 | 1/1999 |
| JP | 2002319704 | 10/2002 |
| JP | 2004006582 | 1/2004 |
| JP | 2008130656 | 6/2008 |
| JP | 2008141015 | 6/2008 |
| JP | 4151284 | 7/2008 |
| KR | 100599012 | 7/2006 |
| KR | 100610650 | 8/2006 |
| KR | 100838197 | 6/2008 |
| KR | 1020100016631 | 2/2010 |
| KR | 1020100036617 | 4/2010 |
| KR | 1020100079843 | 7/2010 |
| TW | 201025556 A | 7/2010 |
| WO | 2004023568 | 3/2004 |

(56) References Cited

FOREIGN PATENT DOCUMENTS

WO      2007001124          1/2007
WO      2009106063  A1      9/2009

OTHER PUBLICATIONS

US 8,314,430 B2, 11/2012, Illek et al. (withdrawn)
English Translation of Chinese Office Action from related Chinese Application No. 201610133009.9 dated Nov. 26, 2019 (29 pages).
English Translation of Chinese Office Action from related Chinese Patent Application No. 201610133009.9 dated May 17, 2019 (16 pages).
Nishida, T. "GaN-free Transparent, ultraviolet light-emitting diodes" App. Phys.Lett., vol. 82, No. 1, (2003), pp. 1-3.
Weyers, M. "Substrates for GaN Technology" Slides/presentation available at http://crysta.physik.hu-berlin.de/as2005/pdf/as2005_talk_08_Weyers.pdf as of Jun. 12, 2007, pp. 1-24.
English Translation of Chinese Office Action from related Chinese Patent Application No. 201610131814.8 dated Dec. 24, 2018 (7 pages).
Request for Ex Parte Reexamination re U.S. Pat. No. 9,070,851, CRU Control No. 90/013,725, filed Apr. 15, 2016.
USPTO Decision on Request for Reexamination re U.S. Pat. No. 9,070,851, CRU Control No. 90/013,725, dated May 18, 2016.
Notice of Allowance of U.S. Appl. No. 12/623,990 dated Apr. 27, 2012.
Non-Final Office Action of U.S. Appl. No. 12/623,968 dated Jan. 17, 2012.
Non-Final Office Action of U.S. Appl. No. 12/623,990 dated Jan. 19, 2012.
Notice of Allowance of U.S. Appl. No. 12/624,011 dated Jan. 24, 2012.
Non-Final Office Action of U.S. Appl. No. 12/123,162 dated Aug. 5, 2010.
Notice of Allowance of U.S. Appl. No. 12/123,162 dated Nov. 30, 2010.
Notice of Allowance of related U.S. Appl. No. 13/345,348 dated Jun. 25, 2012.
Notice of Allowance of related U.S. Appl. No. 12/623,968 dated May 21, 2012.
Non-Final Office Action dated Apr. 13, 2012 for U.S. Appl. No. 13/345,348.
International Search Report and Written Opinion dated May 1, 2012, PCT/kr2011/006544.
Notice of Allowance dated Jan. 11, 2013 issued for U.S. Appl. No. 13/482,851.
Non-Final Office Action dated Jun. 13, 2013, in U.S. Appl. No. 13/865,719.
Notice of Allowance dated Oct. 1, 2013, in U.S. Appl. No. 13/865,719.
Office Action in Chinese Application No. 201610132992.2, dated May 31, 2018.
Office Action in Chinese Patent Application No. 201610131814.8, dated Apr. 4, 2018.
First Office Action in Chinese Patent Application No. 201610131393.9, dated Jan. 19, 2018.
First Office Action in Chinese Application No. 201610133009, dated Nov. 17, 2017.
Non-Final Office Action in U.S. Appl. No. 15/247,516, dated Mar. 9, 2017.
Final Office Action in U.S. Appl. No. 15/247,516, dated Aug. 2, 2017.
Chinese Official Action from corresponding Chinese Patent Application dated Dec. 24, 2018.

* cited by examiner (a)

(b)

(a)

(b)

(a)

(b)

(a)

(b)

(a)

(b)

WAFER-LEVEL LIGHT EMITTING DIODE PACKAGE AND METHOD OF FABRICATING THE SAME

CROSS-REFERENCE TO RELATED APPLICATION

This application is a continuation of U.S. application Ser. No. 15/389,413, filed on Dec. 22, 2016, which is a of U.S. application Ser. No. 15/041,907, filed on Feb. 11, 2016, now U.S. Pat. No. 9,543,490, which is a continuation of application of U.S. application Ser. No. 14/815,433, filed on Jul. 31, 2015, now U.S. Pat. No. 9,293,664, which is a continuation application of U.S. application Ser. No. 14/708,029, filed on May 8, 2015, now U.S. Pat. No. 9,219,196, which is a continuation application of U.S. application Ser. No. 13/194,317, filed on Jul. 29, 2011, now U.S. Pat. No. 9,070,851 which claims priorities and benefits from Korean Patent Application No. 10-2010-0092807, filed on Sep. 24, 2010, and Korean Patent Application No. 10-2010-0092808, filed on Sep. 24, 2010 The above patent applications are hereby incorporated by reference for all purposes as if fully set forth herein.

BACKGROUND OF THE INVENTION

Field of the Invention

The invention relates to a light emitting diode package and a method of fabricating the same and, more particularly, to a wafer-level light emitting diode package and a method of fabricating the same.

Description of the Background

A light emitting diode (LED) is a semiconductor device that includes an N-type semiconductor and a P-type semiconductor, and emits light through recombination of holes and electrons. Such an LED has been used in a wide range of applications such as display devices, traffic lights, and backlight units. Further, considering the potential merits of lower power consumption and longer lifespan than existing electric bulbs or fluorescent lamps, the application range of LEDs has been expanded to general lighting by replacing existing incandescent lamps and fluorescent lamps.

The LED may be used in an LED module. The LED module is manufactured through a process of fabricating an LED chip at a wafer level, a packaging process, and a modulation process. Specifically, semiconductor layers are grown on a substrate such as a sapphire substrate, and subjected to a wafer-level patterning process to fabricate LED chips having electrode pads, followed by division into individual chips (chip fabrication process). Then, after mounting the individual chips on a lead frame or a printed circuit board, the electrode pads are electrically connected to lead terminals via bonding wires, and the LED chips are covered by a molding member, thereby providing an LED package (packaging process). Then, the LED package is mounted on a circuit board such as a metal core printed circuit board (MC-PCB), thereby providing an LED module such as a light source module (modulation process).

In the packaging process, a housing and/or the molding member may be provided to the LED chip to protect the LED chip from the external environment. In addition, a phosphor may be contained in the molding member to convert light emitted by the LED chip so that the LED package may emit a white light, thereby providing a white LED package. Such a white LED package may be mounted on the circuit board such as the MC-PCB and a secondary lens may be provided to the LED package to adjust orientation characteristics of light emitted from the LED package, thereby providing a desired white LED module.

However, it may be difficult to achieve miniaturization and satisfactory heat dissipation of the conventional LED package including the lead frame or printed circuit board. Furthermore, luminous efficiency of the LED may be deteriorated due to absorption of light by the lead frame or the printed circuit board, electric resistance heating by the lead terminals, and the like.

In addition, the chip fabrication process, the packaging process, and the modulation process may be separately carried out, thereby increasing time and costs for manufacturing the LED module.

Meanwhile, alternating current (AC) LEDs have been produced and marketed. The AC LED includes an LED directly connected to an AC power source to permit continuous emission of light. One example of AC LEDs, which can be used by being directly connected to a high voltage AC power source, is disclosed in U.S. Pat. No. 7,417,259, issued to Sakai, et. al.

According to U.S. Pat. No. 7,417,259, LED elements are arranged in a two-dimensional pattern on an insulating substrate, for example, a sapphire substrate, and are connected in series to form LED arrays. The LED arrays are connected in series to each other, thereby providing a light emitting device that can be operated at high voltage. Further, such LED arrays may be connected in reverse parallel to each other on the sapphire substrate, thereby providing a single-chip light emitting device that can be operated to continuously emit light using an AC power supply.

Since the AC-LED includes light emitting cells on a growth substrate, for example, on a sapphire substrate, the AC-LED restricts the structure of the light emitting cells and may limit improvement of light extraction efficiency. Thus, investigation has been made into a light emitting diode, for example, an AC-LED that is based on a substrate separation process and includes light emitting cells connected in series to each other.

SUMMARY OF THE INVENTION

Exemplary embodiments of the invention provide a wafer-level LED package and a method of fabricating the same, which can be directly formed in a module on a circuit board without using a conventional lead frame or printed circuit board.

Exemplary embodiments of the invention also provide a wafer-level LED package and a method of fabricating the same, which has high efficiency and exhibits improved heat dissipation.

Exemplary embodiments of the invention also provide a method of fabricating an LED package, which may reduce manufacturing time and cost of an LED module.

Exemplary embodiments of the invention also provide an LED module and a method of fabricating the same, which has high efficiency and exhibits improved heat dissipation.

Exemplary embodiments of the invention also provide a wafer-level light emitting diode package and a method of fabricating the same, which includes a plurality of light emitting cells and may be directly formed in a module on a circuit board without using a conventional lead frame or printed circuit board.

Additional features of the invention will be set forth in the description which follows and in part will be apparent from the description, or may be learned by practice of the invention.

An exemplary embodiment of the present invention discloses an LED package including: a semiconductor stack including a first conductive type semiconductor layer, an active layer, and a second conductive type semiconductor layer; a plurality of contact holes arranged in the second conductive type semiconductor layer and the active layer, the contact holes exposing the first conductive type semiconductor layer; a first bump arranged on a first side of the semiconductor stack, the first bump being electrically connected to the first conductive type semiconductor layer via the plurality of contact holes; a second bump arranged on the first side of the semiconductor stack, the second bump being electrically connected to the second conductive type semiconductor layer; and a protective insulation layer covering a sidewall of the semiconductor stack.

An exemplary embodiment of the present invention also discloses a light emitting diode module including the LED package according to the aforementioned exemplary embodiments. The LED module may include a circuit board; the LED package mounted on the circuit board; and a lens to adjust an orientation angle of light emitted from the LED package.

An exemplary embodiment of the present invention also discloses a method of fabricating an LED package. The method includes forming a semiconductor stack including a first conductive type semiconductor layer, an active layer, and a second conductive type semiconductor layer on a first substrate; patterning the semiconductor stack to form a chip separation region; patterning the second conductive type semiconductor layer and the active layer to form a plurality of contact holes exposing the first conductive type semiconductor layer; forming a protective insulation layer covering a sidewall of the semiconductor stack in the chip separation region; and forming a first bump and a second bump on the semiconductor stack. The first bump is electrically connected to the first conductive type semiconductor layer via the plurality of contact holes, and the second bump is electrically connected to the second conductive type semiconductor layer.

An exemplary embodiment of the present invention also discloses a light emitting diode package. The LED package includes a plurality of light emitting cells each including a first conductive type semiconductor layer, an active layer, and a second conductive type semiconductor layer; a plurality of contact holes arranged in the second conductive type semiconductor layer and the active layer of each of the light emitting cells, the contact holes exposing the first conductive type semiconductor layer thereof; a protective insulation layer covering a sidewall of each of the light emitting cells; a connector located arranged on a first side of the light emitting cells and electrically connecting two adjacent light emitting cells to each other; a first bump arranged on the first side of the light emitting cells and electrically connected to the first conductive type semiconductor layer via the plurality of contact holes of a first light emitting cell of the light emitting cells; and a second bump arranged in the first side of the light emitting cells and electrically connected to the second conductive type semiconductor layer of a second light emitting cell of the light emitting cells.

An exemplary embodiment of the present invention also discloses a light emitting diode module including the LED package described above. The module includes a circuit board; the LED package arranged on the circuit board; and a lens to adjust an orientation angle of light emitted from the LED package.

An exemplary embodiment of the present invention also discloses a method of fabricating an LED package including a plurality of light emitting cells. The method includes forming a semiconductor stack including a first conductive type semiconductor layer, an active layer, and a second conductive type semiconductor layer on a first substrate; patterning the semiconductor stack to form a chip separation region and a light emitting cell separation region; patterning the second conductive type semiconductor layer and the active layer to form a plurality of light emitting cells, each light emitting cell having a plurality of contact holes exposing the first conductive type semiconductor layer; forming a protective insulation layer covering a sidewall of the semiconductor stack in the chip separation region and the light emitting cell separation region; forming a connector connecting adjacent light emitting cells in series to each other; and forming a first bump and a second bump on the plurality of light emitting cells. Here, the first bump is electrically connected to the first conductive type semiconductor layer via the plurality of contact holes of a first light emitting cell of the light emitting cells, and the second bump is electrically connected to the second conductive type semiconductor layer of a second light emitting cell of the light emitting cells.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
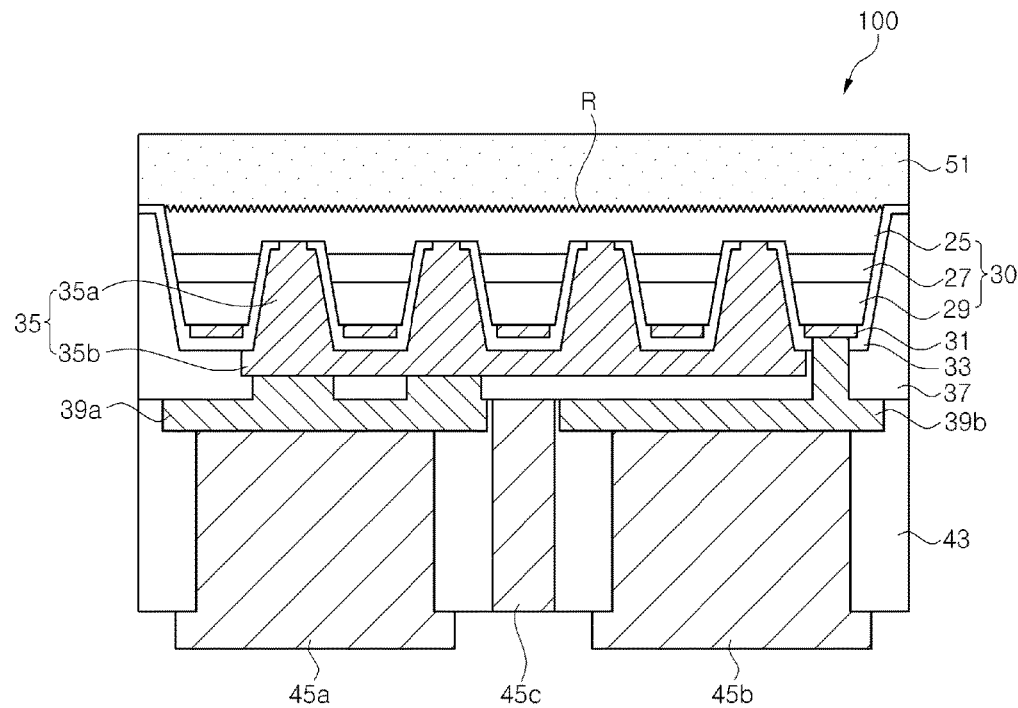
FIG. 1 is a schematic sectional view of a light emitting diode package according to a first exemplary embodiment of the invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough and will fully convey the scope of the invention to those skilled in the art. In the drawings, the sizes and relative sizes of layers and regions may be exaggerated for clarity. Like reference numerals in the drawings denote like elements.

It will be understood that when an element such as a layer, film, region or substrate is referred to as being "on" another element, it can be directly on the other element or intervening elements may also be present. In contrast, when an element is referred to as being "directly on" another element, there are no intervening elements present.

FIG. 1 is a schematic sectional view of an LED package 100 according to a first exemplary embodiment of the invention.

Referring to FIG. 1, the LED package 100 may include a semiconductor stack 30, a first contact layer 35, a second contact layer 31, a first insulation layer 33, a second insulation layer 37, a first electrode pad 39a, a second electrode pad 39b, a first bump 45a, and a second bump 45b. The LED package 100 may further include an insulation layer 43, a dummy bump 45c, and a wavelength convertor 51.

The semiconductor stack 30 includes a first conductive type upper semiconductor layer 25, an active layer 27, and a second conductive type lower semiconductor layer 29. The active layer 27 is interposed between the upper and lower semiconductor layers 25, 29.

The active layer 27 and the upper and lower semiconductor layers 25, 29 may be composed of a III-N based compound semiconductor, for example, (Al, Ga, In)N semiconductor. Each of the upper and lower semiconductor layers 25, 29 may be a single layer or multiple layers. For example, the upper and/or lower semiconductor layers 25, 29 may include a super lattice layer in addition to a contact layer and a clad layer. The active layer 27 may have a single quantum well structure or a multi-quantum well structure. The first conductive type may be an n-type and the second conductive type may be a p-type. Alternatively, the first conductive type may be a p-type and the second conductive type may be an n-type. Since the upper semiconductor layer 25 can be formed of an n-type semiconductor layer having relatively low specific resistance, the upper semiconductor layer 25 may have a relatively high thickness. Therefore, a roughened surface R may be formed on an upper surface of the upper semiconductor layer 25, in which the roughened surface R enhances extraction efficiency of light generated in the active layer 27.

The semiconductor stack 30 has a plurality of contact holes 30a (see FIG. 5(b)) formed through the second conductive type lower semiconductor layer 29 and the active layer 27 to expose the first conductive type upper semiconductor layer, and the first contact layer 35 contacts the first conductive type upper semiconductor layer 25 exposed in the plurality of contact holes.

The second contact layer 31 contacts the second conductive type lower semiconductor layer 29. The second contact layer 31 includes a reflective metal layer to reflect light generated in the active layer 27. Further, the second contact layer 31 may form an ohmic contact with the second conductive type lower semiconductor layer 29.

The first insulation layer 33 covers the second contact layer 31. Further, the first insulation layer 33 covers a sidewall of the semiconductor stack 30 exposed in the plurality of contact holes 30a. In addition, the first insulation layer 33 may cover a side surface of the semiconductor stack 30. The first insulation layer 33 insulates the first contact layer 35 from the second contact layer 31 while insulating the second conductive type lower semiconductor layer 29 and the active layer 27 exposed in the plurality of contact holes 30a from the first contact layer 35. The first insulation layer 33 may be composed of a single layer or multiple layers, such as a silicon oxide or silicon nitride film. Alternatively, the first insulation layer 33 may be composed of a distributed Bragg reflector, which is formed by alternately stacking insulation layers having different indices of refraction, for example, $SiO_2/TiO_2$ or $SiO_2/Nb_2O_5$.

The first contact layer 35 is located under the first insulation layer 33 and contacts the first conductive type upper semiconductor layer 25 through the first insulation layer 33 in the plurality of contact holes 30a. The first contact layer 35 includes contact sections 35a contacting the first conductive type upper semiconductor layer 25, and a connecting section 35b connecting the contact sections 35a to each other. Therefore, the contact sections 35a are electrically connected to each other by the connecting section 35b. The first contact layer 35 is formed under some regions of the first insulation layer 33 and may be composed of a reflective metal layer.

The second insulation layer 37 covers the first contact layer 35 under the first contact layer 35. In addition, the second insulation layer 37 covers the first insulation layer 33 while covering a side surface of the semiconductor stack 30. The second insulation layer 37 may be composed of a single layer or multiple layers. Further, the second insulation layer 37 may be a distributed Bragg reflector.

The first and second electrode pads 39a, 39b are located under the second insulation layer 37. The first electrode pad 39a may be connected to the first contact layer 35 through the second insulation layer 37. Further, the second electrode pad 39b may be connected to the second contact layer 31 through the second insulation layer 37 and the first insulation layer 33.

The first bump 45a and the second bump 45b are located under the first and second electrode pads 39a, 39b to be connected thereto, respectively. The first and second bumps 45a, 45b may be formed by plating. The first and second bumps 45a, 45b are terminals electrically connected to a circuit board such as an MC-PCB and have coplanar distal ends. In addition, the first electrode pad 39a may be formed at the same level as that of the second electrode pad 39b, so that the first bump 45a and the second bump 45b may also be formed on the same plane. Therefore, the first and second bumps 45a, 45b may have the same height.

Meanwhile, the dummy bump 45c may be located between the first bump 45a and the second bump 45b. The dummy bump 45c may be formed together with the first and second bumps 45a and 45b to provide a heat passage for discharging heat from the semiconductor stack 30.

The insulation layer 43 may cover side surfaces of the first and second bumps 45a, 45b. The insulation layer 43 may also cover a side surface of the dummy bump 45c. In addition, the insulation layer 43 fills spaces between the first bump 45a, the second bump 45b and the dummy bump 45c to prevent moisture from entering the semiconductor stack 30 from outside. The insulation layer 43 also covers side surfaces of the first and second electrode pads 39a, 39b to protect the first and second electrode pads 39a, 39b from external environmental factors such as moisture. Although the insulation layer 43 may be configured to cover the overall side surfaces of the first and second bumps 45a, 45b, the invention is not limited thereto. Alternatively, the insulation layer 43 may cover the side surfaces of the first and second bumps 45a, 45b except for some regions of the side surface near distal ends of the first and second bumps.

In the present exemplary embodiment, the insulation layer 43 is illustrated as covering the side surfaces of the first and second electrode pads 39a and 39b, but the invention is not limited thereto. Alternatively, another insulation layer may be used to cover the first and second electrode pads 39a, 39b and the insulation layer 43 may be formed under the other insulation layer. In this case, the first and second bumps 45a, 45b may be connected to the first and second electrode pads 39a, 39b through the other insulation layer.

The wavelength convertor 51 may be located on the first conductive type upper semiconductor layer 25 opposite to the rest of the semiconductor stack 30. The wavelength convertor 51 may contact an upper surface of the first conductive type upper semiconductor layer 25. The wavelength convertor 51 may be a phosphor sheet having a uniform thickness without being limited thereto. Alternatively, the wavelength converter 51 may be a substrate, for example, a sapphire substrate or a silicon substrate, which is doped with an impurity for wavelength conversion.

In the present exemplary embodiment, the side surface of the semiconductor stack 30 is covered with a protective insulation layer. The protective insulation layer may include, for example, the first insulation layer 33 and/or the second insulation layer 37. In addition, the first contact layer 35 may be covered with the second insulation layer 37 to be protected from an external environment and the second contact layer 31 may be covered with the first insulation layer 33 and the second insulation layer 37 to be protected from an external environment. The first and second electrode pads 39a, 39b are also protected by, for example, the insulation layer 43. Accordingly, it is possible to prevent deterioration of the semiconductor stack 30 due to moisture.

The wavelength convertor 51 may be attached to the first conductive type upper semiconductor layer 25 at a wafer-level, and then divided together with the protective insulation layer during a chip separation process. Therefore, a side surface of the wavelength convertor 51 may be in a line with the protective insulation layer. That is, the side surface of the wavelength converter 51 may be flush along a straight line with a side surface of the protective insulation layer. Further, the side surface of the wavelength convertor 51 may be in a line with a side surface of the insulation layer 43. Thus, the side surfaces of the wavelength converter 51, the protective insulation layer, and the insulation layer 43 may all be flush along a straight line.

Figure 2:
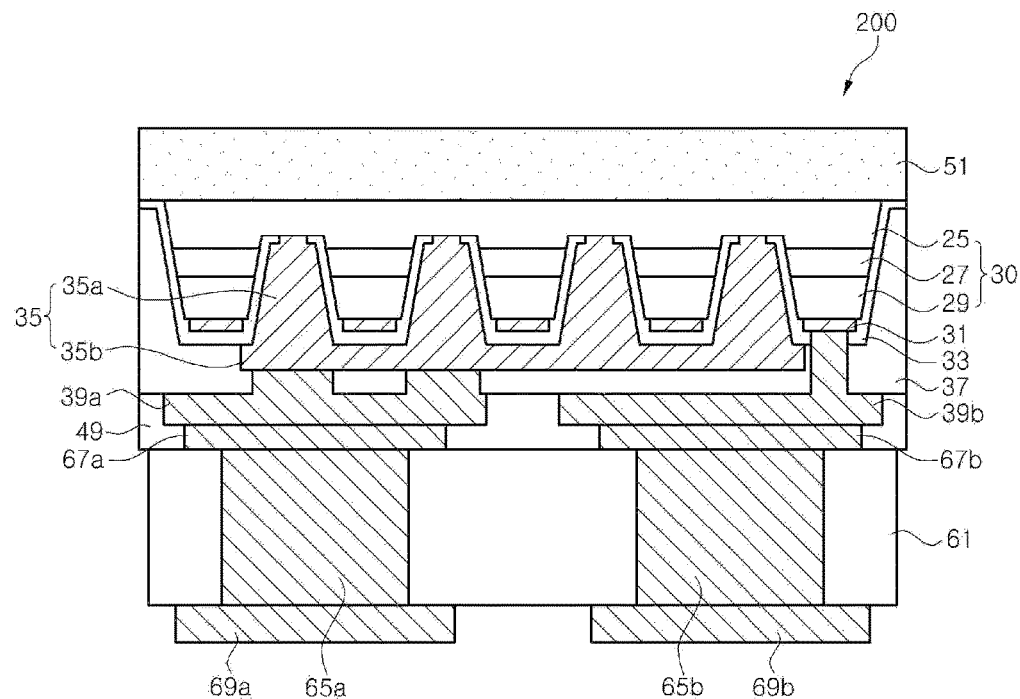
FIG. 2 is a schematic sectional view of a light emitting diode package according to a second exemplary embodiment of the invention.

FIG. 2 is a schematic sectional view of a light emitting diode package 200 according to a second exemplary embodiment of the invention.

Referring to FIG. 2, the LED package 200 is similar to the LED package 100 according to the above exemplary embodiment. In the present exemplary embodiment, however, first and second bumps 65a, 65b are formed in a substrate 61.

Specifically, the substrate 61 includes through-holes, which have the first and second bumps 65a, 65b formed therein, respectively. The substrate 61 is an insulation substrate, for example, a sapphire substrate or a silicon substrate, but is not limited thereto. The substrate 61 having the first and second bumps 65a, 65b may be attached to a first electrode pad 39a and a second electrode pad 39b. In this case, to prevent the first and second electrode pads 39a, 39b from being exposed to the outside, an insulation layer 49 may cover side surfaces and bottom surfaces of the first and second electrode pads 39a, 39b. Further, the insulation layer 49 may have openings, which expose the first and second electrode pads 39a, 39b, and additional metal layers 67a, 67b are then formed in the openings. The additional metal layers 67a, 67b may be composed of a bonding metal.

Figure 3:
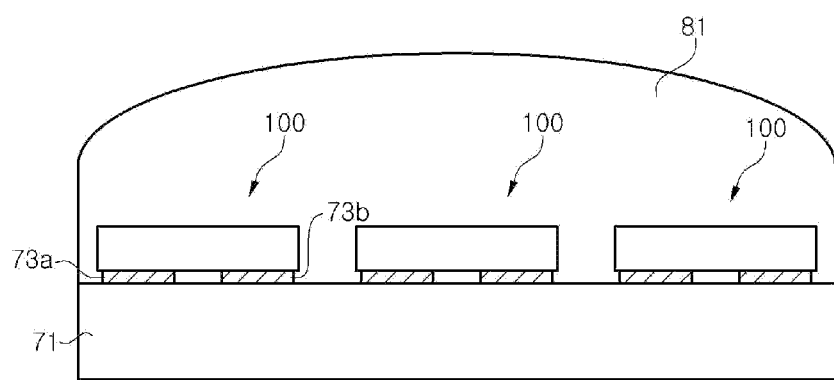
FIG. 3 is a sectional view of a light emitting diode module including the light emitting diode package according to the first exemplary embodiment.

FIG. 3 is a sectional view of a light emitting diode module including the LED package 100 according to the first exemplary embodiment.

Referring to FIG. 3, the LED module includes a circuit board 71, for example, an MC-PCB, the LED package 100, and a lens 81. The circuit board 71, for example, the MC-PCB, has connection pads 73a, 73b for mounting the LED packages 100 thereon. The first and second bumps 45a, 45b (see FIG. 1) of the LED package 100 are connected to the connection pads 73a, 73b, respectively.

A plurality of LED packages 100 may be mounted on the circuit board 71 and the lens 81 may be disposed on the LED packages 100 to adjust an orientation angle of light emitted from the LED packages 100.

In accordance with the second exemplary embodiment, the light emitting diode packages 200 may be mounted on the circuit board instead of the LED packages 100.

FIG. 4 to FIG. 12 show a method of fabricating the LED package 100 according to the first exemplary embodiment. In FIG. 5 to FIG. 10, (a) is a plan view and (b) is a sectional view taken along line A-A of (a).

Figure 4:
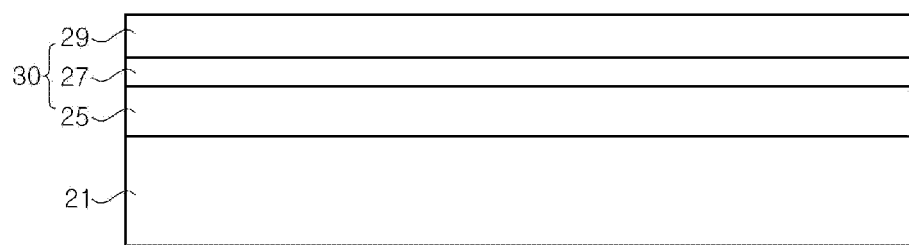
FIG. 4 to FIG. 12 show a method of fabricating the light emitting diode package according to the first exemplary embodiment, in which (a) is a plan view and (b) is a sectional view taken along line A-A of (a) in FIG. 5 to FIG. 10.

Referring to FIG. 4, a semiconductor stack 30, which includes a first conductive type semiconductor layer 25, an active layer 27 and a second conductive type semiconductor layer 29, is formed on a growth substrate 21. The growth substrate 21 may be a sapphire substrate but is not limited thereto. Alternatively, the growth substrate 21 may be another kind of heterogeneous substrate, for example, a silicon substrate. Each of the first and second conductive type semiconductor layers 25, 29 may be composed of a single layer or multiple layers. Further, the active layer 27 may have a single-quantum well structure or multi-quantum well structure.

The compound semiconductor layers may be formed of III-N based compound semiconductor on the growth substrate 21 by metal organic chemical vapor deposition (MOCVD) or molecular beam epitaxy (MBE).

A buffer layer (not shown) may be formed before forming the compound semiconductor layers. The buffer layer is formed to relieve lattice mismatch between the growth substrate 21 and the compound semiconductor layers and may be formed of a GaN-based material layer such as gallium nitride or aluminum nitride.

Figure 5:
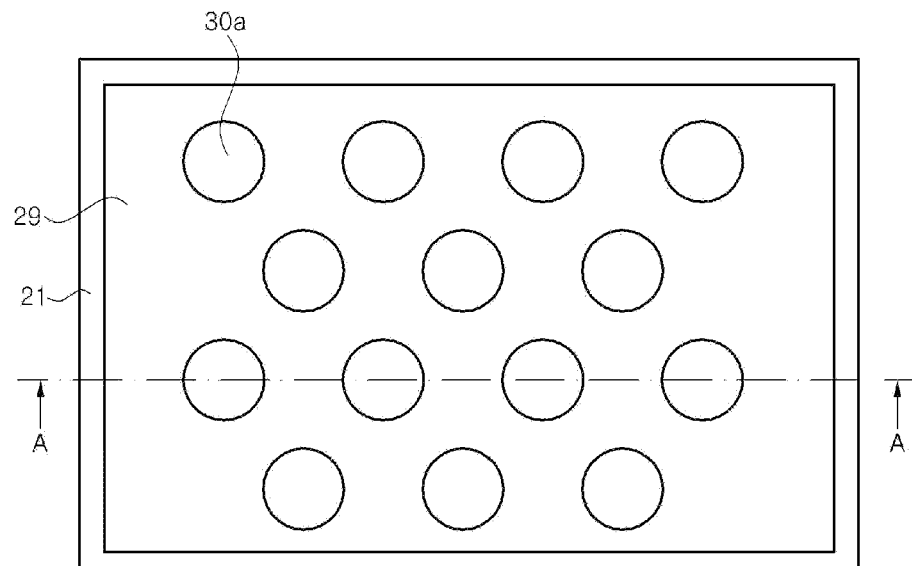
Figure 5:
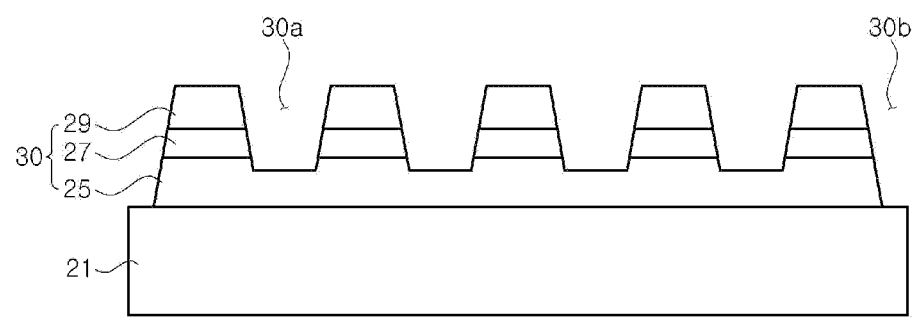

Referring to (a) and (b) of FIG. 5, the semiconductor stack 30 is patterned to form a chip (package) separation region 30b while patterning the second conductive type semiconductor layer 29 and the active layer 27 to form a plurality of contact holes 30a exposing the first conductive type semiconductor layer 25. The semiconductor stack 30 may be patterned by photolithography and etching processes.

The chip separation region 30b is a region for dividing the LED package structure into individual LED packages and side surfaces of the first conductive type semiconductor layer 25, the active layer 27 and the second conductive type semiconductor layer 29 are exposed on the chip separation region 30b. Advantageously, the chip separation region 30b may be configured to expose the substrate 21 without being limited thereto.

The plurality of contact holes 30a may have a circular shape, but is not limited thereto. The contact holes 30 may have a variety of shapes. The second conductive type semiconductor layer 29 and the active layer 27 are exposed to sidewalls of the plurality of contact holes 30a. As shown, the contact holes 30a may have slanted sidewalls.

Figure 6:
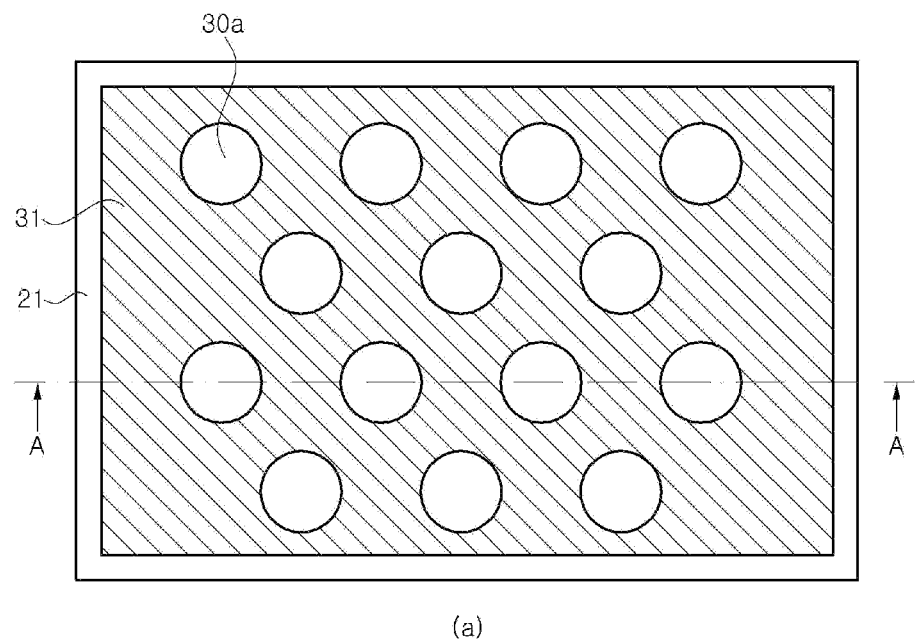
Figure 6:
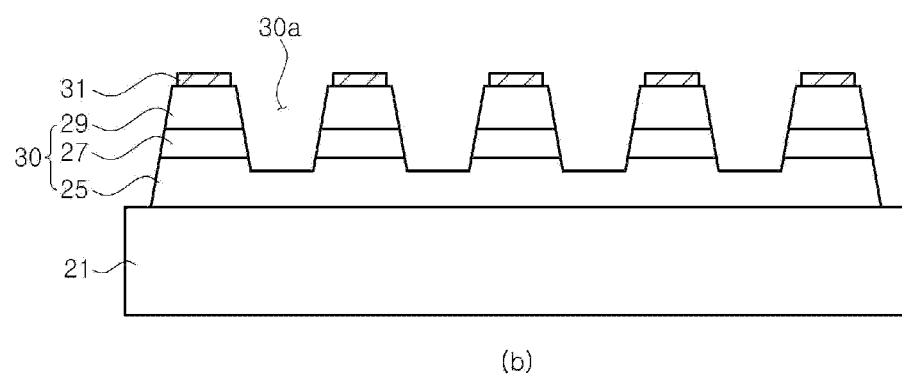

Referring to (a) and (b) of FIG. 6, a second contact layer 31 is formed on the second conductive type semiconductor layer 29. The second contact layer 31 is formed on the semiconductor stack 30 except for regions corresponding to the plurality of contact holes 30a.

The second contact layer 31 may include a transparent conductive oxide film such as indium tin oxide (ITO) or a reflective metal layer such as silver (Ag) or aluminum (Al). The second contact layer 31 may be composed of a single layer or multiple layers. The second contact layer 31 may also be configured to form an ohmic contact with the second conductive type semiconductor layer 29.

The second contact layer 31 may be formed before or after formation of the plurality of contact holes 30a.

Figure 7:
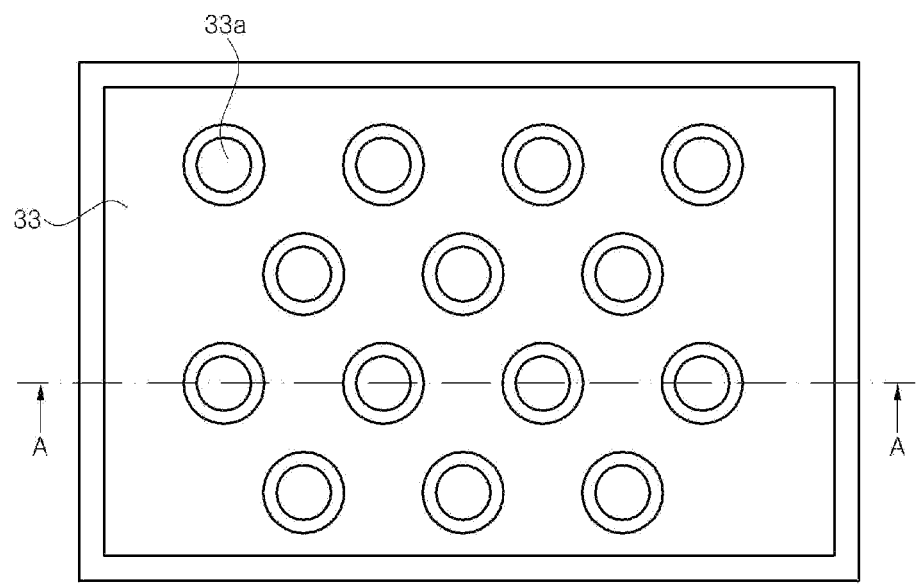
Figure 7:
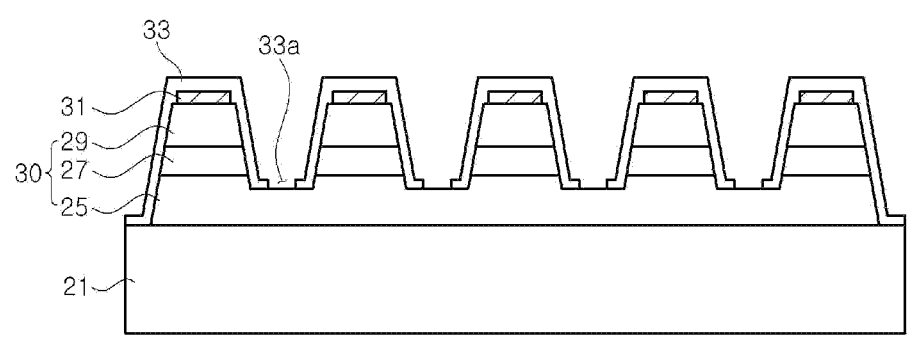

Referring to (a) and (b) of FIG. 7, a first insulation layer 33 is formed to cover the second contact layer 31. The first insulation layer 33 may cover the side surface of the semiconductor stack 30 exposed to the chip separation region 30b while covering the sidewalls of the plurality of contact holes 30a. Here, the first insulation layer 33 may have openings 33a, which expose the first conductive type semiconductor layer 25 in the plurality of contact holes 30a.

The first insulation layer 33 may be composed of a single layer or multiple layers, such as a silicon oxide or silicon nitride film. Alternatively, the first insulation layer 33 may be composed of a distributed Bragg reflector, which is formed by alternately stacking insulation layers having different indices of refraction. For example, the first insulation layer 33 may be formed by alternately stacking $SiO_2/TiO_2$ or $SiO_2/Nb_2O_5$. Further, the first insulation layer 33 may be formed to provide a distributed Bragg reflector having high reflectivity over a wide wavelength range of blue, green, and red light by adjusting the thickness of each of the insulation layers.

Figure 8:
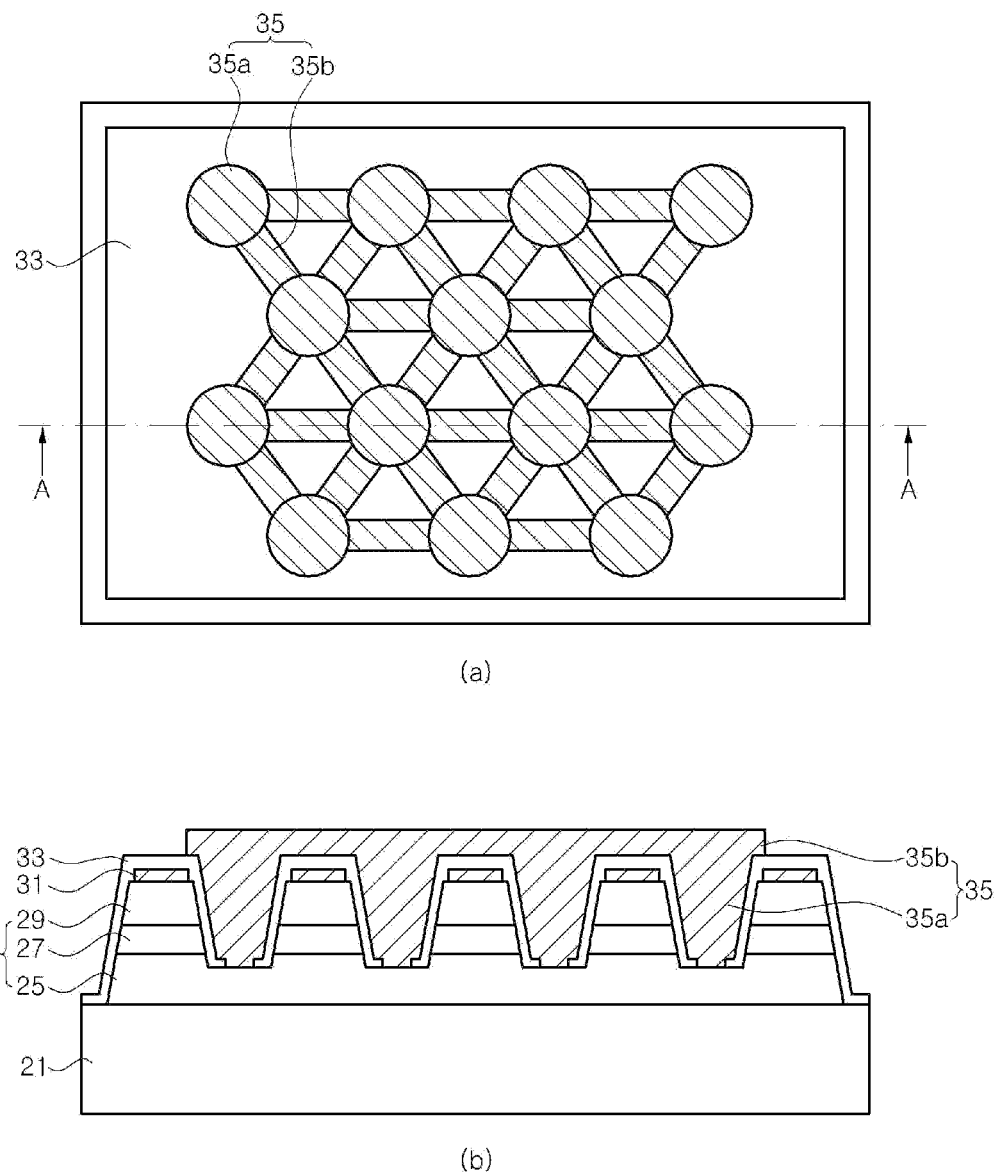

Referring to (a) and (b) of FIG. 8, a first contact layer 35 is formed on the first insulation layer 33. The first contact layer 35 includes contact sections 35a contacting the first conductive type upper semiconductor layer 25 exposed in the contact holes 30a, and a connecting section 35b connecting the contact sections 35a to each other. The first contact layer 35 may be composed of a reflective metal layer, but is not limited thereto.

The first contact layer 35 is formed on some regions of the semiconductor stack 30, so that the first insulation layer 33 is exposed on other regions of the semiconductor stack 30 where the first contact layer 35 is not formed.

Figure 9:
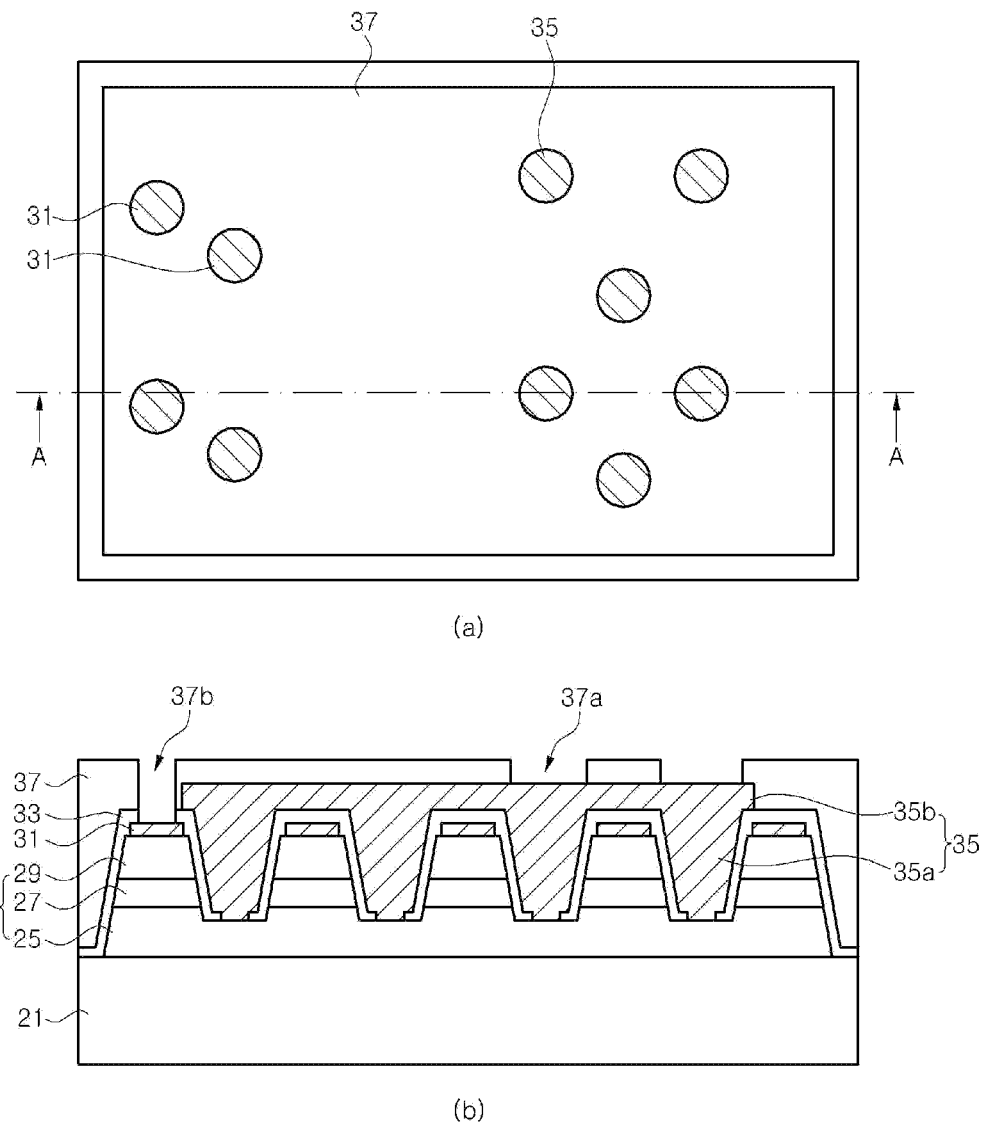

Referring to (a) and (b) of FIG. 9, a second insulation layer 37 is formed on the first contact layer 35. The second insulation layer 37 may be composed of a single layer or multiple layers, such as a silicon oxide or silicon nitride film.

Further, the second insulation layer 37 may be composed of a distributed Bragg reflector, which is formed by alternately stacking insulation layers having different indices of refraction.

The second insulation layer 37 may cover the first contact layer 35 while covering the first insulation layer 33. The second insulation layer 37 may also cover the side surface of the semiconductor stack 30 in the chip separation region 30b.

The second insulation layer 37 has an opening 37a which exposes the first contact layer 35. Further, the second insulation layer 37 and the first insulation layer 33 are formed with an opening 37b, which exposes the second contact layer 31.

Figure 10:
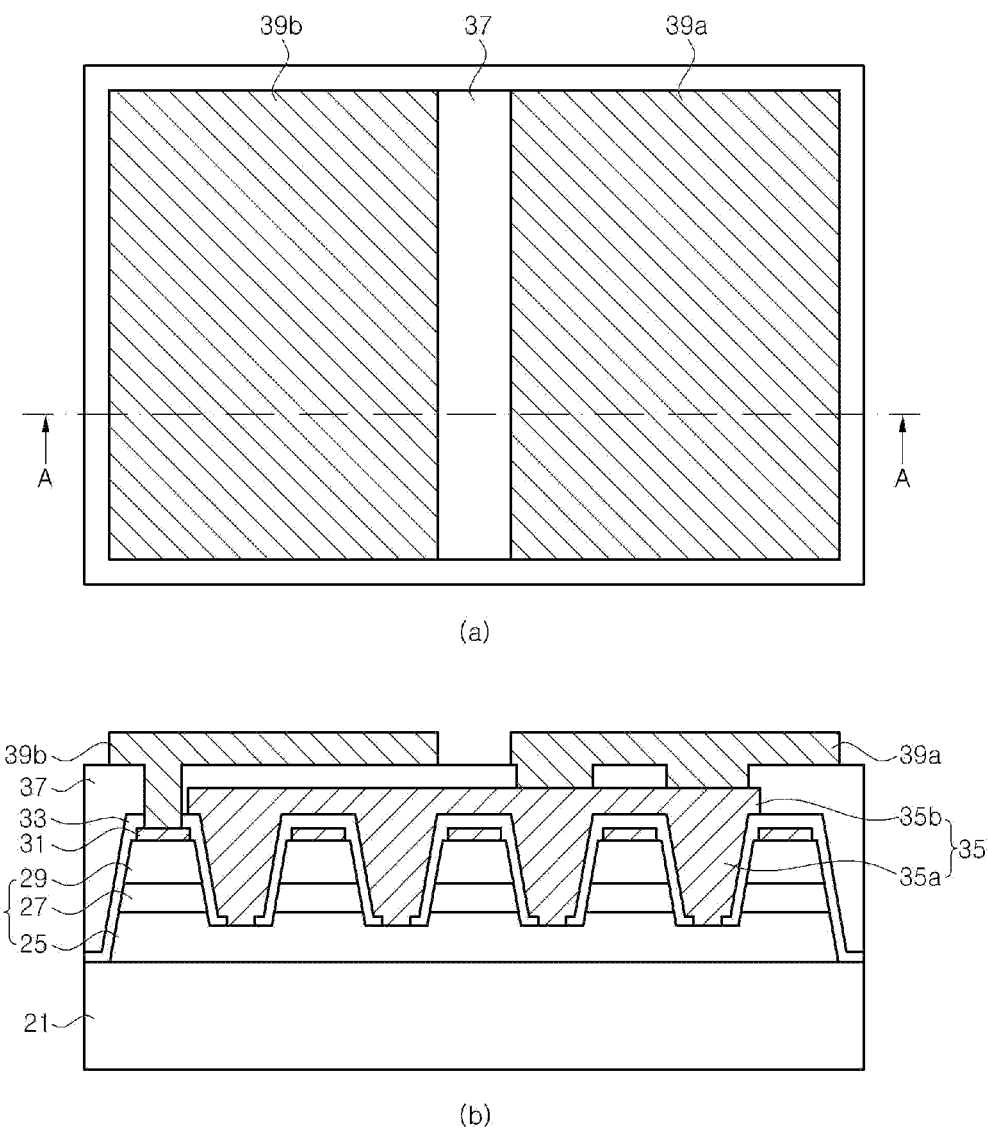

Referring to (a) and (b) of FIG. 10, first and second electrode pads 39a, 39b are formed on the second insulation layer 37. The first electrode pad 39a is connected to the first contact layer 35 through the opening 37a and the second electrode pad 39b is connected to the second contact layer 31 through the opening 37b.

The first electrode pad 39a is separated from the second electrode pad 39b and each of the first and second electrode pads 39a, 39b may have a relatively large area from a top perspective, for example, an area not less than ⅓ of the area of the LED package.

Figure 11:
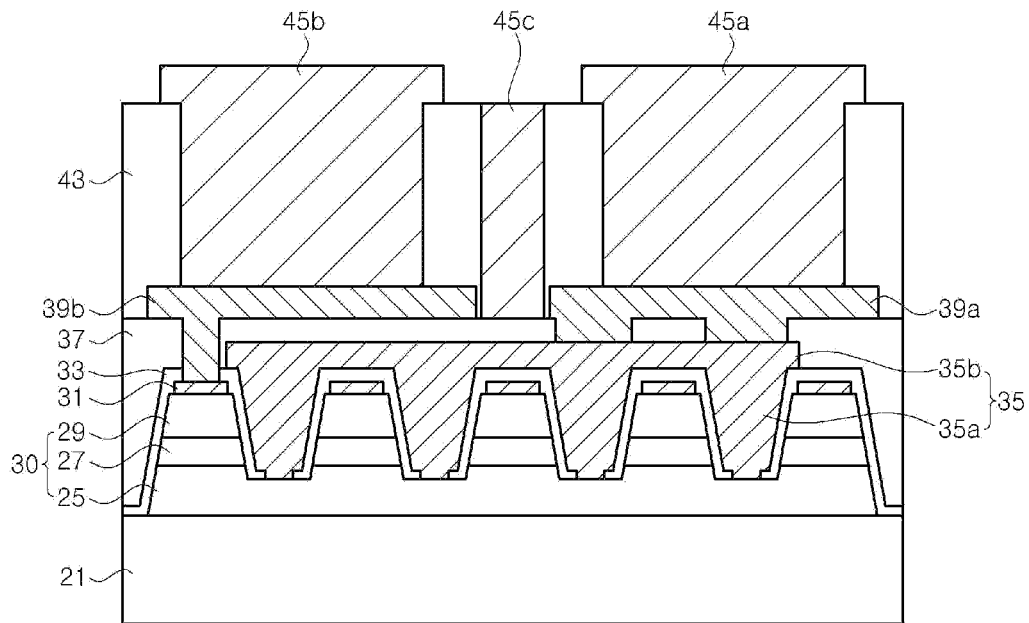

Referring to FIG. 11, an insulation layer 43 is formed on the first and second electrode pads 39a, 39b. The insulation layer 43 covers the first and second electrode pads 39a, 39b and has grooves which expose upper surfaces of the electrode pads 39a, 39b. Further, the insulation layer 43 may have a groove which exposes the second insulation layer 37 between the first and second electrode pads 39a, 39b.

Then, first and second bump 45a, 45b are formed in the grooves of the insulation layer 43, and a dummy bump 45c may be formed between the first bump and the second bump.

The bumps may be formed by plating, for example, electroplating, using a metallic material. If necessary, a seed layer for plating may also be formed.

After the first and second bumps 45a, 45b are formed, the insulation layer 43 may be removed. For example, the insulation layer 43 may be formed of a polymer such as photoresist and may be removed after the bumps are formed. Alternatively, the insulation layer 43 may remain to protect the side surfaces of the first and second bumps 45a, 45b.

In the present exemplary embodiment, the insulation layer 43 is illustrated as being directly formed on the first and second electrode pads 39a, 39b. In other exemplary embodiments, another insulation layer may be formed to cover the first and second electrode pads 39a, 39b. The other insulation layer may be configured to have openings exposing the first and second electrode pads 39a, 39b. Then, the processes of forming the insulation layer 43 and the bumps may be carried out.

Figure 12:
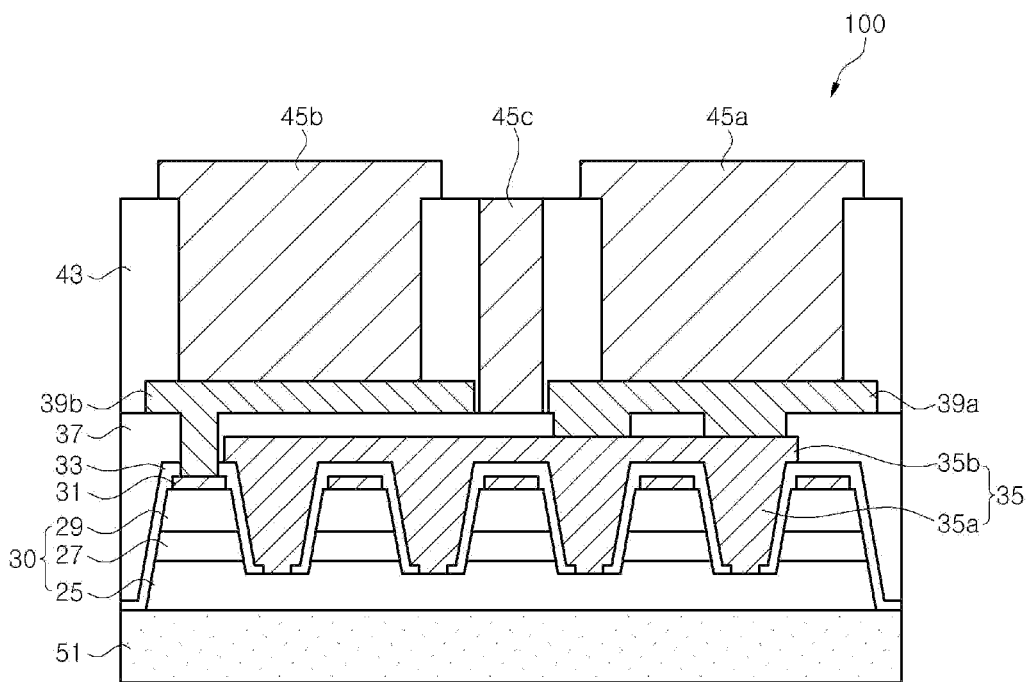

Referring to FIG. 12, the growth substrate 21 is removed and a wavelength convertor 51 is attached to the first conductive type semiconductor layer 25. The growth substrate 21 may be removed by an optical technique such as laser lift-off (LLO), mechanical polishing or chemical etching.

Then, the exposed surface of the first conductive type semiconductor layer 25 is subjected to anisotropic etching such as photoelectrochemical (PEC) etching to form a roughened surface on the exposed first conductive type semiconductor layer 25.

Meanwhile, the wavelength convertor such as a phosphor sheet containing phosphors may be attached to the first conductive type semiconductor layer 25.

Alternatively, the growth substrate 21 may contain an impurity for converting a wavelength of light generated in the active layer 27. In this case, the growth substrate 21 may be used as the wavelength convertor 51.

Then, the LED package structure is divided into individual packages along the chip separation region 30b, thereby providing finished LED packages 100. At this time, the second insulation layer 37 is cut together with the wavelength convertor 51 so that cut planes thereof can be formed in a line.

Figure 13:
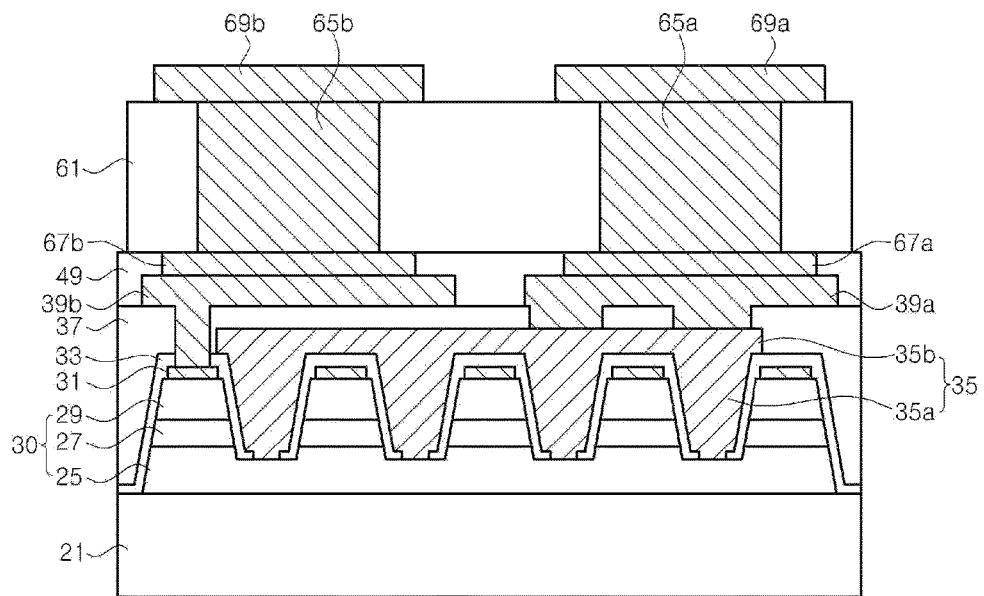
FIG. 13 is a sectional view showing a method of fabricating the light emitting diode package according to the second exemplary embodiment of the invention.

FIG. 13 is a sectional view showing a method of fabricating the LED package 200 according to the second exemplary embodiment of the present invention.

Referring to FIG. 13, in the method of fabricating the LED package 200 according to the present exemplary embodiment, the processes until the first and second electrode pads 39a, 39b are formed are the same as those of the method of fabricating the LED package 100 described above (FIGS. 10(a) and (b)).

After the first and second electrode pads 39a, 39b are formed, an insulation layer 49 is formed to cover the first and second electrode pads 39a, 39b. The insulation layer 49 may cover side surfaces of the first and second electrode pads 39a, 39b to protect the first and second electrode pads 39a, 39b. The insulation layer 49 has openings which expose the first and second electrode pads 39a, 39b. Additional metal layers 67a, 67b are then formed in the openings. The additional metal layers 67a, 67b may be composed of a bonding metal.

The substrate 61 is bonded to the first and second electrode pads 39a, 39b. The substrate 61 may have through-holes, in which the first and second bumps 65a, 65b may be formed. Further, the first and second bumps may be formed at distal ends thereof with pads 69a, 69b. The substrate 61 having the first and second bumps 65a, 65b and the pads 69a, 69b may be separately prepared and bonded to a wafer having the first and second electrode pads 39a, 39b.

Then, as described with reference to FIG. 12, the growth substrate 21 is removed and a wavelength convertor 51 may be attached to the first conductive type semiconductor layer 25, followed by division of the LED package structure into individual LED packages. As a result, the finished LED packages 200 as described in FIG. 2 are provided.

Figure 14:
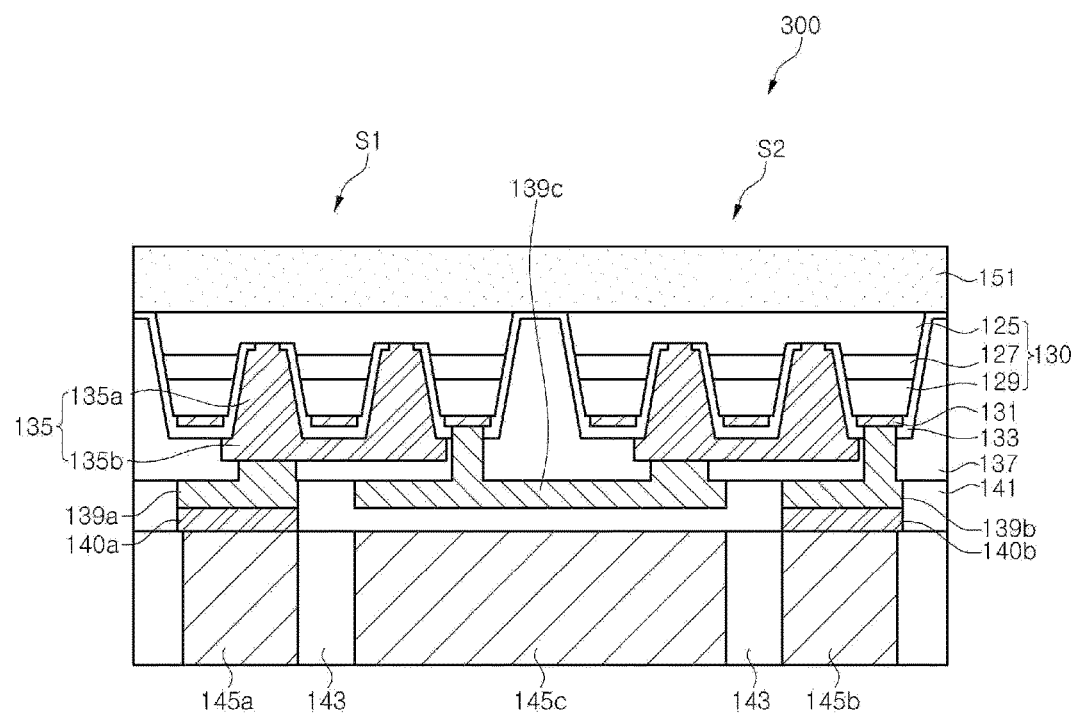
FIG. 14 is a schematic sectional view of a light emitting diode package according to a third exemplary embodiment of the invention.

FIG. 14 is a sectional view of an LED package 300 according to a third exemplary embodiment of the present invention.

Referring to FIG. 14, the LED package 300 may include a semiconductor stack 130, which is divided into a plurality of light emitting cells (only two light emitting cells S1, S2 are shown herein), a first contact layer 135, a second contact layer 131, a first insulation layer 133, a second insulation layer 137, a first electrode pad 139a, a second electrode pad 139b, a connector 139c connecting adjacent light emitting cells to each other in series, a first bump 145a and a second bump 145b. Further, the LED package 300 may include a third insulation layer 141, an insulation layer 143, a dummy bump 145c, a wavelength convertor 151, and additional metal layers 140a, 140b.

The semiconductor stack 130 includes a first conductive type upper semiconductor layer 125, an active layer 127, and a second conductive type lower semiconductor layer 129. The semiconductor stack 130 of the present exemplary embodiment is similar to the semiconductor stack 30 described in FIG. 1, and a detailed description thereof will be omitted herein.

Each of the light emitting cells S1, S2 has a plurality of contact holes 130a (see FIG. 18(b)) extending through the second conductive type lower semiconductor layer 129 and the active layer 127 to expose the first conductive type upper semiconductor layer, and the first contact layer 135 contacts the first conductive type upper semiconductor layer 125 exposed in the plurality of contact holes. The light emitting cells S1, S2 are separated from each other by a cell separation region 130b (see FIG. 18(b)).

The second contact layer 131 contacts the second conductive type lower semiconductor layer 129 of each of the light emitting cells S1, S2. The second contact layer 131 includes a reflective metal layer to reflect light generated in the active layer 127. Further, the second contact layer 131 may form an ohmic contact with the second conductive type lower semiconductor layer 129.

The first insulation layer 133 covers the second contact layer 131. Further, the first insulation layer 133 covers a sidewall of the semiconductor stack 130 exposed in the plurality of contact holes 130a. In addition, the first insulation layer 133 may cover a side surface of each of the light emitting cells S1, S2. The first insulation layer 133 insulates the first contact layer 135 from the second contact layer 131 while insulating the second conductive type lower semiconductor layer 129 and the active layer 127 exposed in the plurality of contact holes 130a from the first contact layer 35. The first insulation layer 133 may be composed of a single layer or multiple layers, such as a silicon oxide or silicon nitride film. Furthermore, the first insulation layer 133 may be composed of a distributed Bragg reflector, which is formed by alternately stacking insulation layers having different indices of refraction, for example, $SiO_2/TiO_2$ or $SiO_2/Nb_2O_5$.

The first contact layer 135 is located under the first insulation layer 133 and contacts the first conductive type upper semiconductor layer 125 through the first insulation layer 133 in the plurality of contact holes 130a in each of the light emitting cells S1, S2. The first contact layer 135 includes contact sections 135a contacting the first conductive type upper semiconductor layer 125, and a connecting section 135b connecting the contact sections 135a to each other. Therefore, the contact sections 135a are electrically connected to each other by the connecting section 135b. The first contact layers 135 located under the respective light emitting cells S1, S2 are separated from each other and formed under some regions of the first insulation layer 133. The first contact layer 135 may be composed of a reflective metal layer.

The second insulation layer 137 covers the first contact layer 135 under the first contact layer 135. In addition, the second insulation layer 137 may cover the first insulation layer 133 while covering the side surface of each of the light emitting cells S1, S2. The second insulation layer 137 may be composed of a single layer or multiple layers. Alternatively, the second insulation layer 37 may be composed of a distributed Bragg reflector.

The first electrode pad 139a and the second electrode pad 139b are located under the second insulation layer 137. The first electrode pad 139a may be connected to the first contact layer 135 of a first light emitting cell S1 through the second insulation layer 137. Further, the second electrode pad 139b may be connected to the second contact layer 31 of a second light emitting cell S2 through the second insulation layer 137 and the first insulation layer 133.

The connector 139c is located under the second insulation layer 137 and electrically connects two adjacent light emitting cells S1, S2 to each other through the second insulation layer 137. The connector 139c may connect the second contact layer 131 of one light emitting cell S1 to the first contact layer 135 of another light emitting cell S2 adjacent thereto, so that the two light emitting cells S1, S2 are connected in series to each other.

In the present exemplary embodiment, two light emitting cells S1, S2 are illustrated. However, it should be understood that two or more light emitting cells may be connected in series to each other by a plurality of connectors 139c. Here, the first and second electrode pads 139a, 139b may be connected in series to the light emitting cells S1, S2 located at opposite ends of such series array.

Meanwhile, the third insulation layer 141 may cover the first electrode pad 139a, the second electrode pad 139b and the connector 139c under the first electrode pad 139a, the second electrode pad 139b and the connector 139c. The third insulation layer 141 may have an opening exposing the first electrode pad 139a and the second electrode pad 139b. The third insulation layer 141 may be formed of a silicon oxide or silicon nitride film.

The first bump 145a and the second bump 145b are located under the first and second electrode pads 139a, 139b, respectively. The first and second bumps 145a, 145b may be formed by plating. The first and second bumps 145a, 145b are terminals electrically connected to a circuit board such as an MC-PCB and have distal ends coplanar with each other. In addition, the first electrode pad 139a may be formed at the same level as that of the second electrode pad 139b, so that the first bump 45a and the second bump 45b may also be formed on the same plane. Therefore, the first and second bumps 45a, 45b may have the same height.

The additional metal layers 140a, 140b may be interposed between the first bump 145a and the first electrode pad 139a and between the second bump 145b and the second electrode pad 139b. Here, the additional metal layers 140a, 140b are provided to form the first and second electrode pads 139a, 139b to be higher than the connector 139c and may be located inside openings of the third insulation layer 141. The first and second electrode pads 139a, 139b and the additional metal layers 140a, 140b may constitute final electrode pads.

Meanwhile, the dummy bump 145c may be located between the first bump 145a and the second bump 145b. The dummy bump 145c may be formed together with the first and second bump 145a, 145b to provide a heat passage for discharging heat from the light emitting cells S1, S2. The dummy bump 145c is separated from the connector 139c by the third insulation layer 141.

The insulation layer 143 may cover side surfaces of the first and second bumps 145a, 145b. The insulation layer 143 may also cover a side surface of the dummy bump 145c. In addition, the insulation layer 143 fills spaces between the first bump 145a, the second bump 145b and the dummy bump 145c to prevent moisture from entering the semiconductor stack 130 from outside. Although the insulation layer 143 may be configured to cover the overall side surfaces of the first and second bumps 145a, 145b, the invention is not limited thereto. Alternatively, the insulation layer 143 may cover the side surfaces of the first and second bumps 145a, 145b except for some regions of the side surface near distal ends of the first and second bumps.

The wavelength convertor 151 may be located on the light emitting cells S1, S2. The wavelength convertor 151 may contact an upper surface of the first conductive type upper semiconductor layer 125. The wavelength convertor 151 also covers a cell separation region 130b and a chip separation region. The wavelength convertor 151 may be a phosphor sheet having a uniform thickness without being limited thereto. Alternatively, the wavelength converter 51 may be a substrate, for example, a sapphire substrate or a silicon substrate, which is doped with an impurity for wavelength conversion.

In the present embodiment, the side surfaces of the light emitting cells S1, S2 are covered with a protective insulation layer. The protective insulation layer may include, for example, the first insulation layer 133 and/or the second insulation layer 137. In addition, the first contact layer 135 may be covered with the second insulation layer 137 to be protected from external environment and the second contact layer 131 may be covered with the first insulation layer 133 and the second insulation layer 137 to be protected from external environment. Further, the first and second electrode pads 139a, 139b are also protected by, for example, the third insulation layer 141. Accordingly, it is possible to prevent deterioration of the light emitting cells S1, S2 due to moisture.

The wavelength convertor 151 may be attached to the first conductive type upper semiconductor layer 125 at a wafer-level, and then divided together with the protective insulation layer during a chip separation process (or package separation process). Therefore, a side surface of the wavelength convertor 151 may be in a line with the protective insulation layer. Further, the side surface of the wavelength convertor 151 may be in a line with a side surface of the insulation layer 143.

Figure 15:
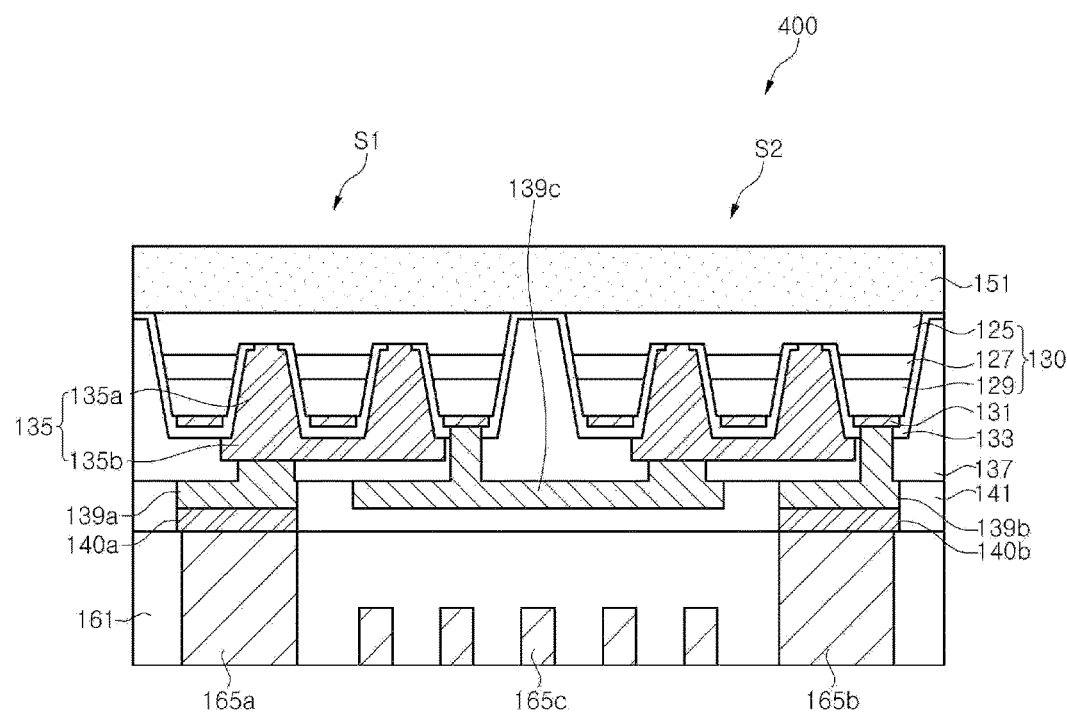
FIG. 15 is a schematic sectional view of a light emitting diode package according to a fourth exemplary embodiment of the invention.

FIG. 15 is a schematic sectional view of a light emitting diode package 400 according to a fourth exemplary embodiment of the present invention.

Referring to FIG. 15, the LED package 400 is similar to the LED package 300 according to the above exemplary embodiment. In present exemplary embodiment, however, first and second bumps 165a, 165b are formed in a substrate 161.

Specifically, the substrate 161 includes through-holes, which have the first and second bumps 165a, 165b formed therein, respectively. The substrate 161 is an insulation substrate, for example, a sapphire substrate or a silicon substrate, but is not limited thereto.

The substrate 161 having the first and second bumps 165a, 165b may be attached to a third insulation layer 141, and the first and second bumps 165a, 165b may be connected to first and second electrode pads 139a, 139b, respectively. Here, the first and second bumps 165a, 165b may be bonded to additional metal layers 140a, 140b, respectively.

Figure 16:
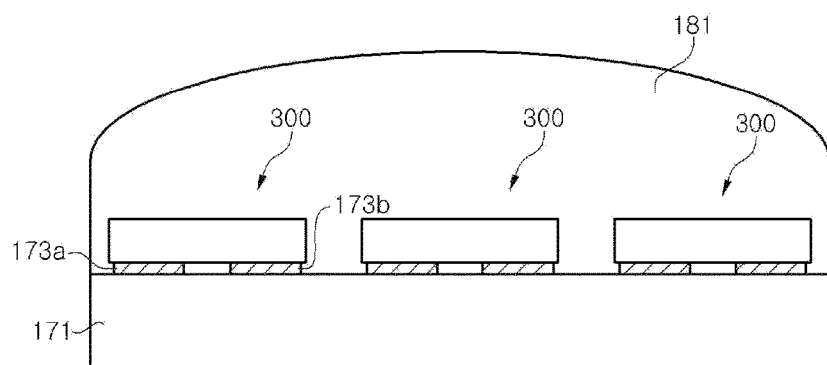
FIG. 16 is a sectional view of a light emitting diode module including the light emitting diode package according to the third exemplary embodiment.

FIG. 16 is a sectional view of a light emitting diode module including the LED packages 300 according to the third exemplary embodiment on a circuit board.

Referring to FIG. 16, the LED module includes a circuit board 171, for example, an MC-PCB, the LED package 300, and a lens 181. The circuit board 171, for example, the MC-PCB, has connection pads 173a, 173b for mounting the LED packages 300 thereon. The first and second bumps 145a, 145b (see FIG. 14) of the LED package 300 are connected to the connection pads 73a, 73b, respectively.

A plurality of LED packages 300 may be mounted on the circuit board 171 and the lens 181 may be disposed on the LED packages 300 to adjust an orientation angle of light emitted from the LED packages 300.

In other exemplary embodiments, instead of the LED packages 300, the light emitting diode packages 400 may be mounted on the circuit board.

FIG. 17 to FIG. 25 show a method of fabricating the LED package 300 according to the third exemplary embodiment. In FIG. 18 to FIG. 23, (a) is a plan view and (b) is a sectional view taken along line A-A of (a).

Figure 17:
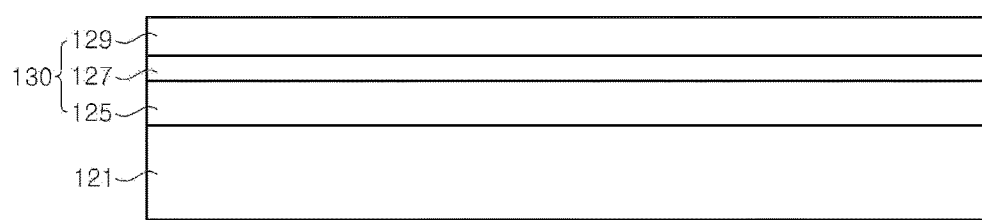
FIG. 17 to FIG. 26 show a method of fabricating the light emitting diode package according to the third exemplary embodiment, in which (a) is a plan view and (b) is a sectional view taken along line A-A of (a) in FIG. 18 to FIG. 23.

Referring to FIG. 17, a semiconductor stack 130, which includes a first conductive type semiconductor layer 125, an active layer 127 and a second conductive type semiconductor layer 129, is formed on a growth substrate 121. The growth substrate 121 and the semiconductor stack 130 are similar to the substrate 21 and the semiconductor stack 30 described with reference to FIG. 4, and a detailed description thereof will thus be omitted herein.

Figure 18:
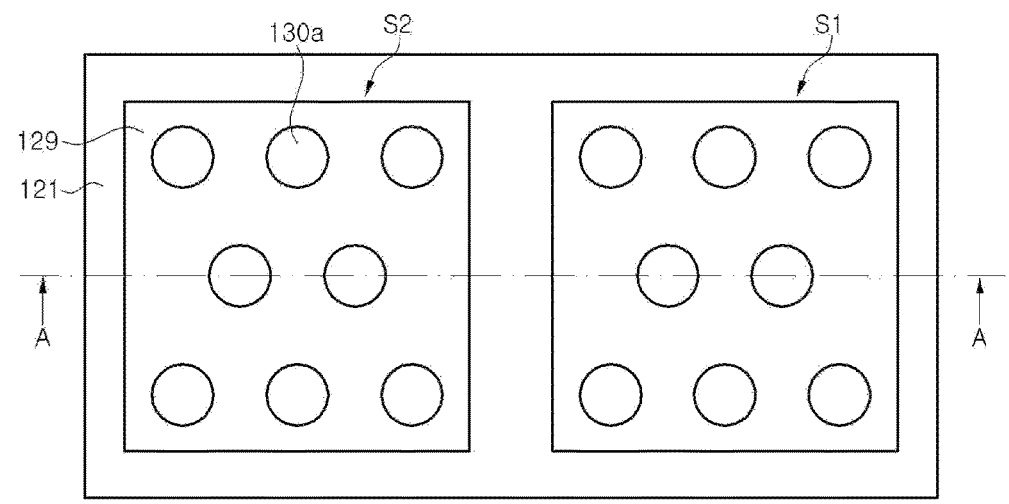
Figure 18:
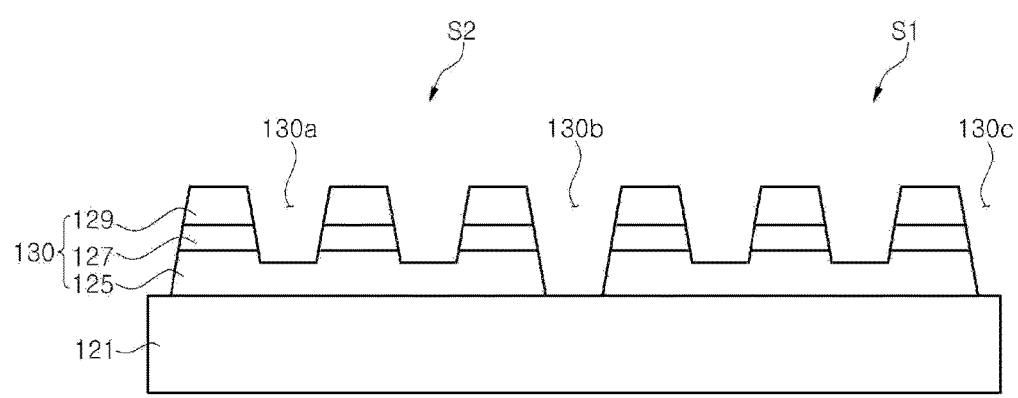

Referring to (a) and (b) of FIG. 18, the semiconductor stack 130 is patterned to form a chip (package) separation region 130c and a cell separation region 130b while patterning the second conductive type semiconductor layer 129 and the active layer 127 to form light emitting cells S1, S2, each having a plurality of contact holes 130a exposing the first conductive type semiconductor layer 125. The semiconductor stack 130 may be patterned by photolithography and etching processes.

The chip separation region 130c is a region for dividing the LED package structure into individual LED packages and side surfaces of the first conductive type semiconductor layer 125, the active layer 127 and the second conductive type semiconductor layer 129 are exposed at the chip separation region 130c. Advantageously, the chip separation region 130c and the cell separation region 130b may be configured to expose the substrate 121 without being limited thereto.

The plurality of contact holes 130a may have a circular shape, but is not limited thereto. The contact holes 130 may have a variety of shapes. The second conductive type semiconductor layer 129 and the active layer 127 are exposed to sidewalls of the plurality of contact holes 130a. The contact holes 130a may have slanted sidewalls.

Figure 19:
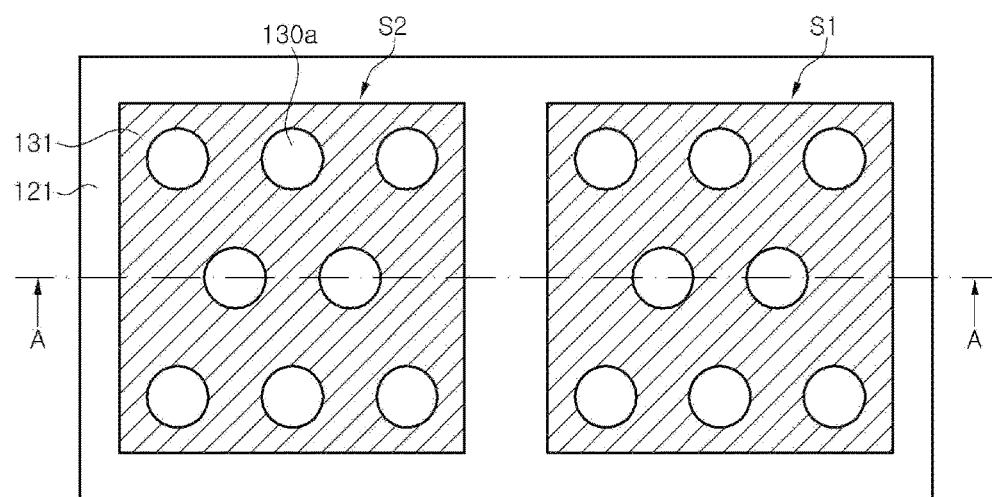
Figure 19:
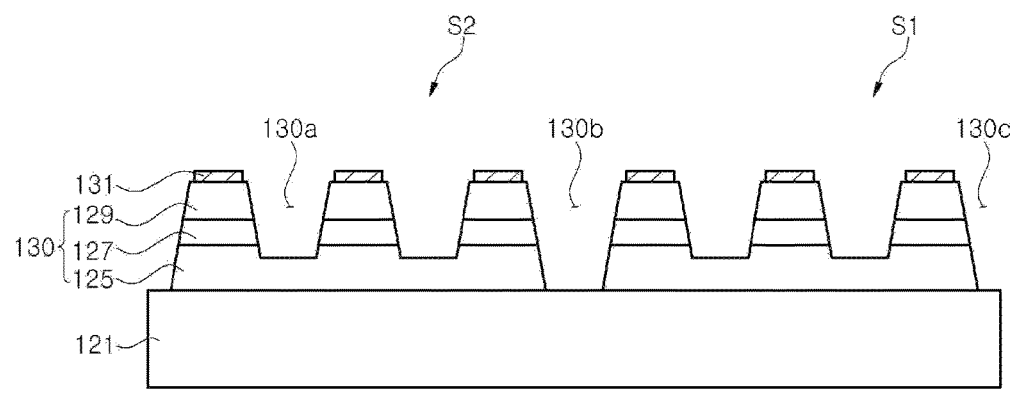

Referring to (a) and (b) of FIG. 19, a second contact layer 131 is formed on the second conductive type semiconductor layer 129. The second contact layer 131 is formed on the semiconductor stack 130 in each of the light emitting cells S1, S2 except for regions corresponding to the plurality of contact holes 130a.

The second contact layer 131 may include a transparent conductive oxide film such as indium tin oxide (ITO) or a reflective metal layer such as silver (Ag) or aluminum (Al).

The second contact layer 131 may be composed of a single layer or multiple layers. The second contact layer 131 may also be configured to form an ohmic contact with the second conductive type semiconductor layer 129.

Figure 20:
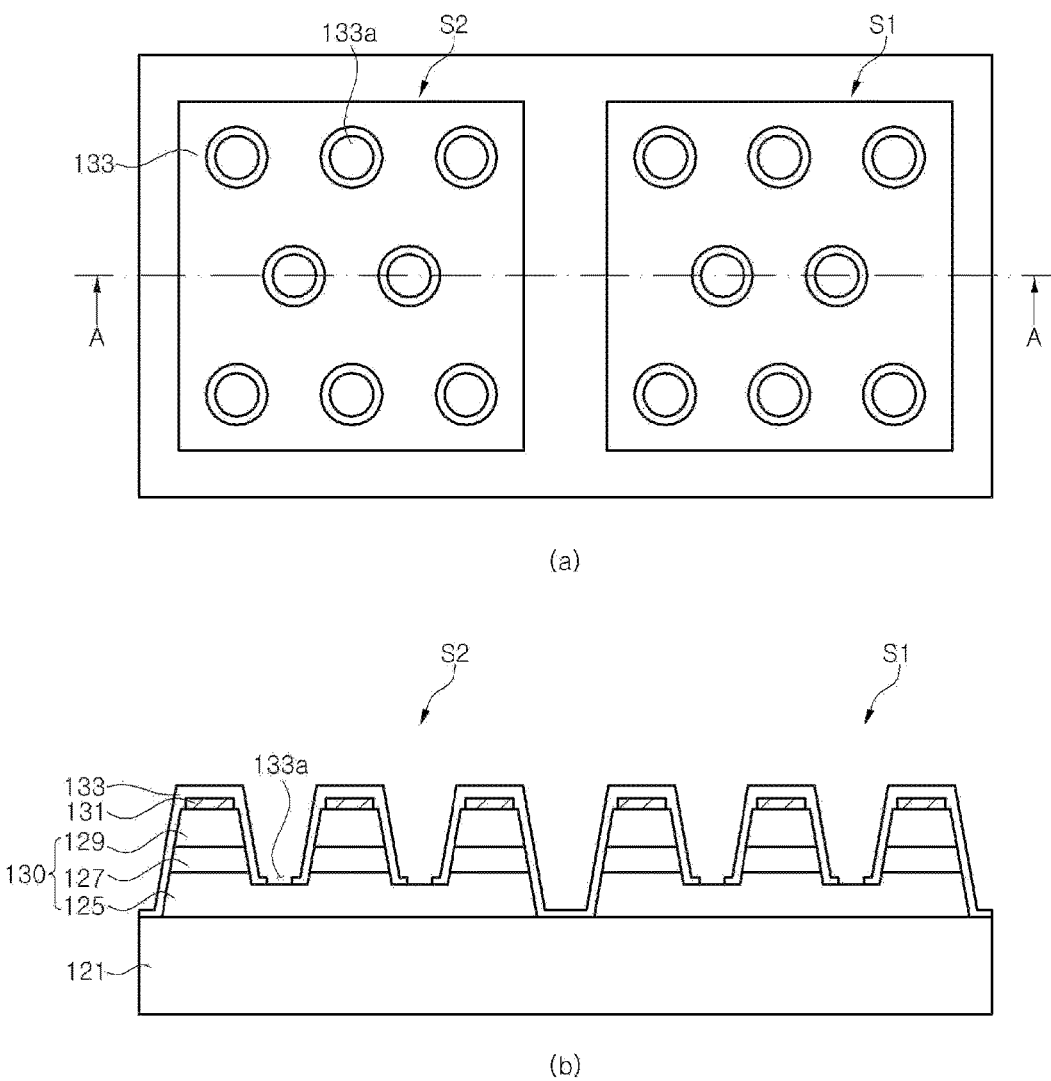

The second contact layer 131 may be formed before or after the formation of the plurality of contact holes 130a Referring to (a) and (b) of FIG. 20, a first insulation layer 133 is formed to cover the second contact layer 131. The first insulation layer 133 may cover the side surface of each of the light emitting cells S1, S2 while covering the sidewalls of the plurality of contact holes 130a. Here, the first insulation layer 133 may have openings 133a, which expose the first conductive type semiconductor layer 125 in the plurality of contact holes 130a.

The first insulation layer 133 may be composed of a single layer or multiple layers, such as a silicon oxide or silicon nitride film. In addition, the first insulation layer 133 may be composed of a distributed Bragg reflector, which is formed by alternately stacking insulation layers having different indices of refraction. For example, the first insulation layer 133 may be formed by alternately stacking $SiO_2/TiO_2$ or $SiO_2/Nb_2O_5$. Further, the first insulation layer 133 may be formed to provide a distributed Bragg reflector having high reflectivity over a wide wavelength range of blue, green, and red light by adjusting the thickness of each of the insulation layers.

Figure 21:
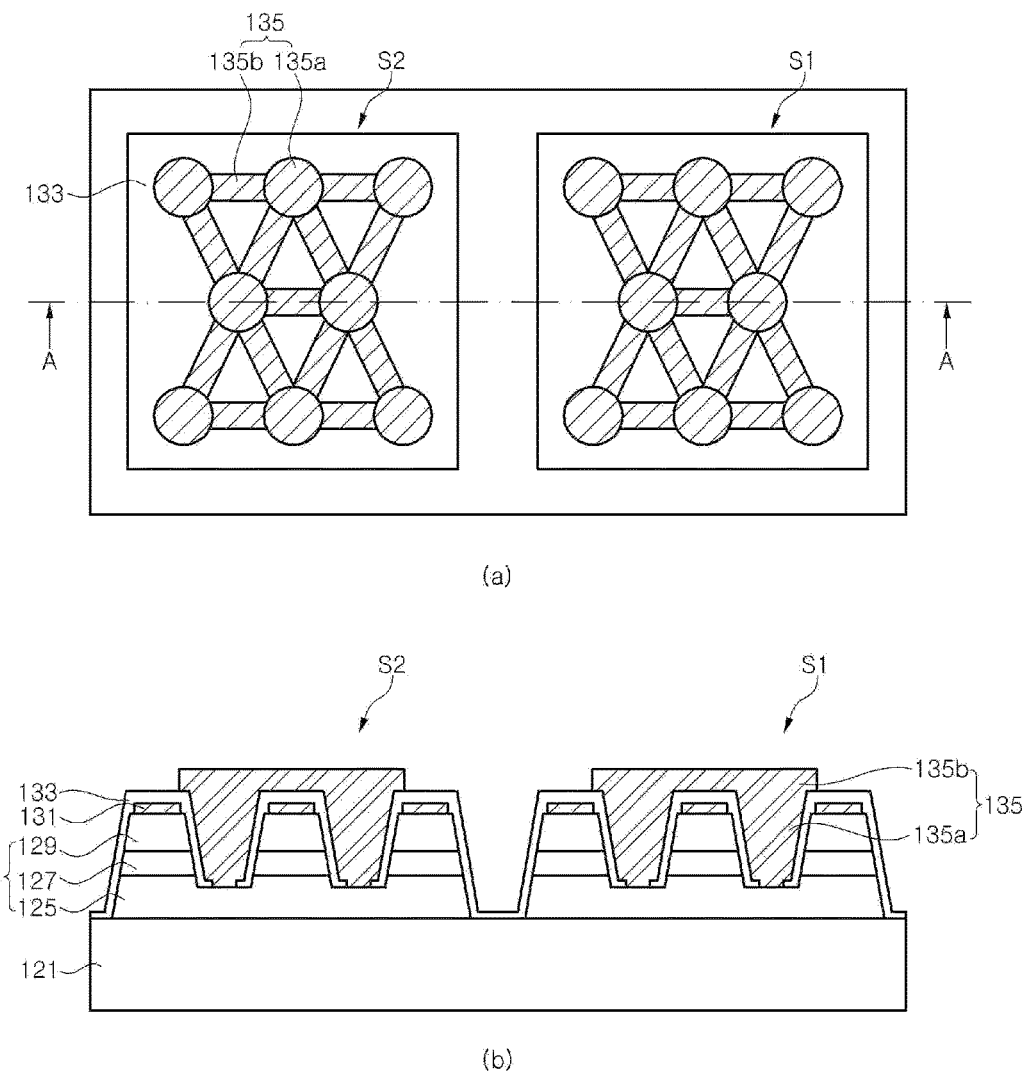

Referring to (a) and (b) of FIG. 21, a first contact layer 135 is formed on the first insulation layer 133. The first contact layer 135 is formed on each of the light emitting cells S1, S2, and includes contact sections 35a contacting the first conductive type upper semiconductor layer 125 exposed in the contact holes 130a and a connecting section 135b connecting the contact sections 135a to each other. The first contact layer 135 may be composed of a reflective metal layer, but is not limited thereto.

The first contact layer 135 is formed on some regions of each of the light emitting cells S1, S2, so that the first insulation layer 133 is exposed at other regions of the semiconductor stack 130 where the first contact layer 135 is not formed.

Figure 22:
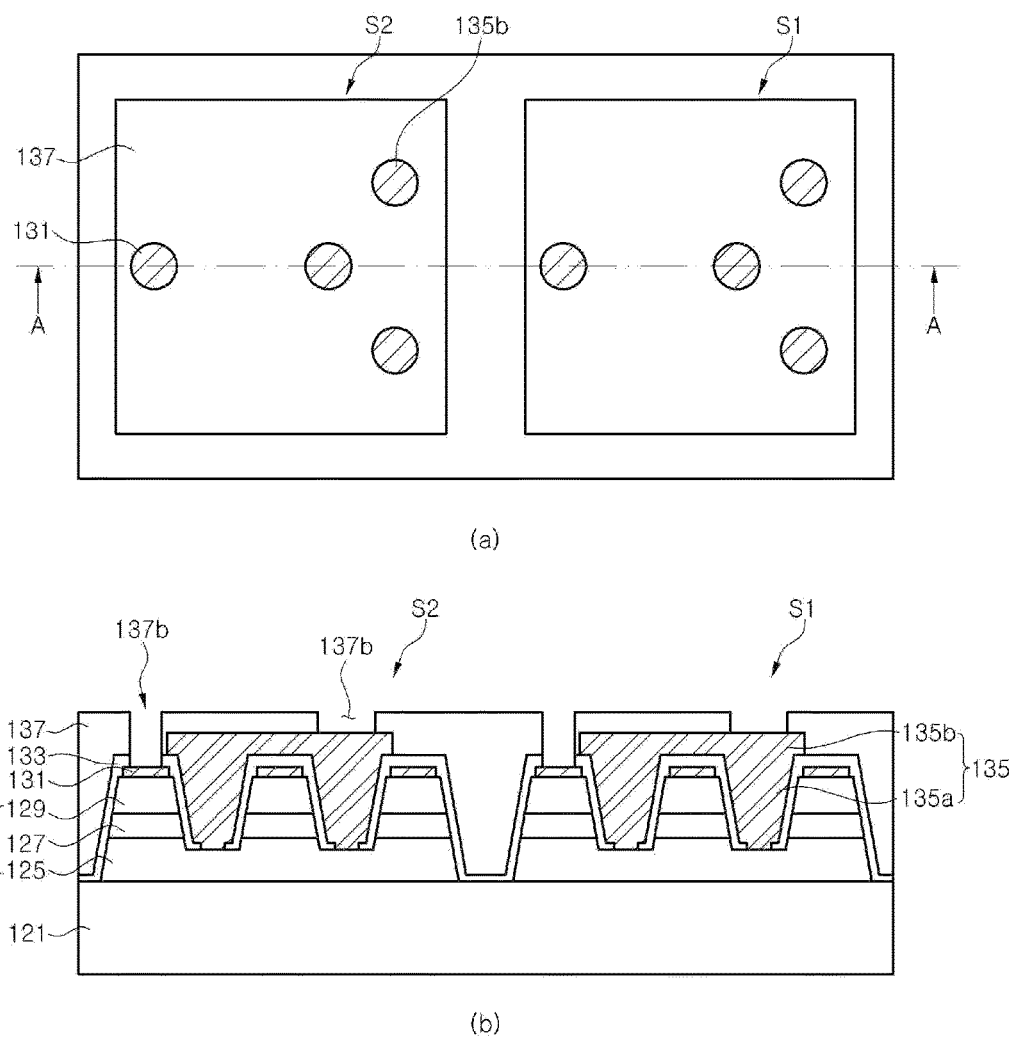

Referring to (a) and (b) of FIG. 22, a second insulation layer 137 is formed on the first contact layer 135. The second insulation layer 137 may be composed of a single layer or multiple layers, such as a silicon oxide or silicon nitride film. Alternatively, the second insulation layer 137 may be composed of a distributed Bragg reflector, which is formed by alternately stacking insulation layers having different indices of refraction.

The second insulation layer 137 may cover the first contact layer 135 while covering the first insulation layer 133. The second insulation layer 137 may also cover the side surface of the each of the light emitting cells S1, S2. In addition, the second insulation layer 137 may fill in the chip separation region 130c and the cell separation region 130b.

The second insulation layer 137 has an opening 137a which exposes the first contact layer 135 of each of the light emitting cells S1, S2. Further, the second insulation layer 137 and the first insulation layer 133 are formed with an opening 137b, which exposes the second contact layer 131.

Figure 23:
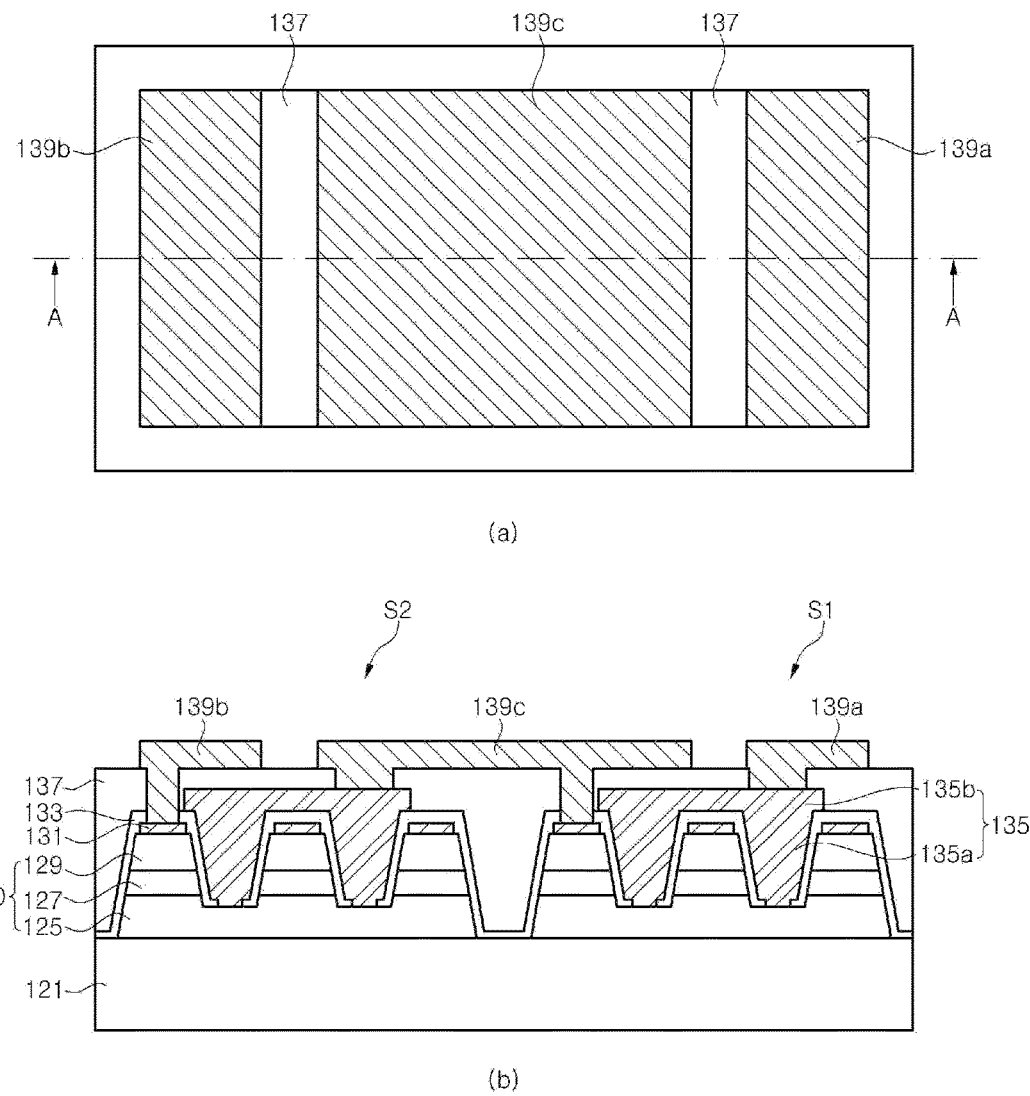

Referring to (a) and (b) of FIG. 23, a connector 139c and first and second electrode pads 139a, 139b are formed on the second insulation layer 137. The first electrode pad 139a is connected to the first contact layer 135 of a first light emitting cell S1 through the opening 137a and the second electrode pad 139b is connected to the second contact layer 131 of a second light emitting cell S2 through the opening 137b. Further, the connector 139c connects the first contact layer 135 and the second contact layer 131 of adjacent light emitting cells S1, S2 to each other in series through the openings 137a, 137b.

Figure 24:
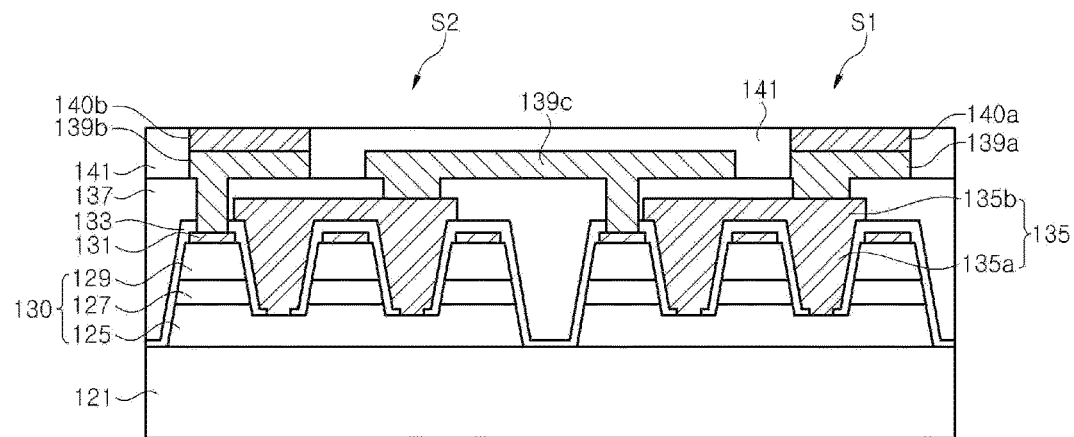

Referring to FIG. 24, a third insulation layer 141 is formed on the first and second electrode pads 139a, 139b and the connector 139c. The third insulation layer 141 covers the first and second electrode pads 139a, 139b and the connector 139c, and has grooves which expose upper surfaces of the electrode pads 139a, 139b. Meanwhile, the third insulation layer 141 may have additional metal layers 140a, 140b formed in the grooves thereof. The additional metal layers 140a, 140b increase the height of the electrode pads 139a, 139b, such that final electrode pads may have a greater height than the connector 139c. The additional metal layers 140a, 140b may be formed before the formation of the third insulation layer 141. Upper surfaces of the additional metal layers 140a, 140b may be substantially coplanar with an upper surface of the third insulation layer 141.

Figure 25:
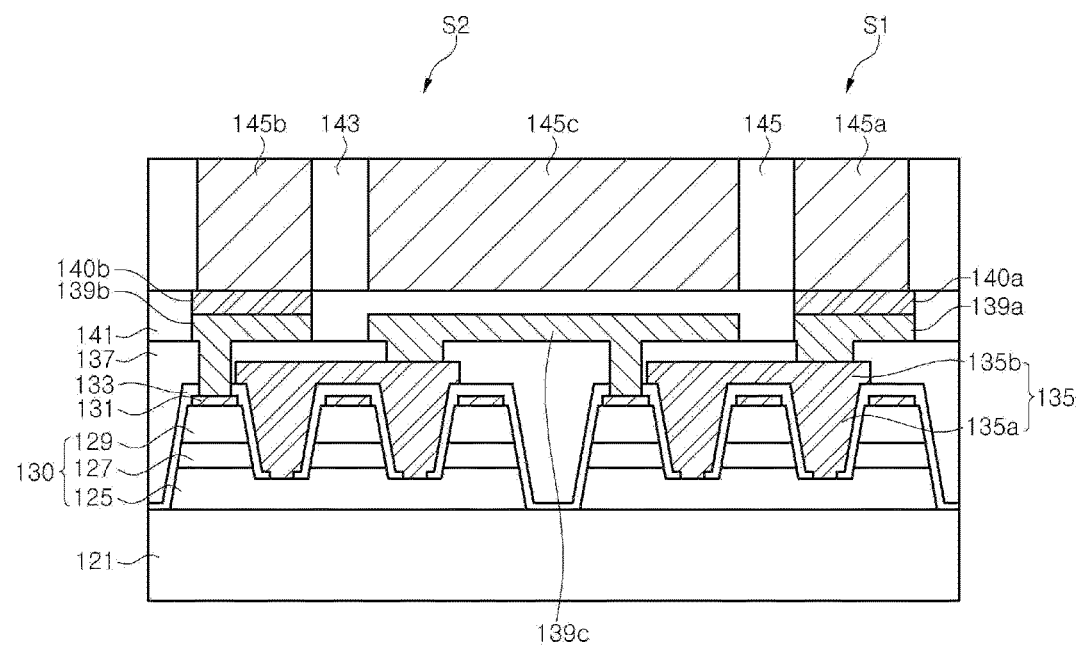

Referring to FIG. 25, a patterned insulation layer 143 is formed on the third insulation layer 141. The patterned insulation layer 143 has grooves, which expose the upper side of the first and second electrode pads 139a, 139b, for example, the additional metal layers 140a, 140b. Further, the patterned insulation layer 143 may have a groove exposing the third insulation layer 141 between the first electrode pad 139a and the second electrode pad 139b.

Then, first and second bumps 145a, 145b are formed in the grooves of the insulation layer 143 and a dummy bump 145c may be formed between the first and second bumps.

The bumps may be formed by plating, for example, electroplating. As needed, a seed layer for plating may also be formed.

After the first and second bumps 145a, 145b are formed, the insulation layer 143 may be removed. For example, the insulation layer 143 may be formed of a polymer such as photoresist and may be removed after the bumps are formed. Alternatively, the insulation layer 143 may remain to protect the side surfaces of the first and second bumps 145a, 145b.

Figure 26:
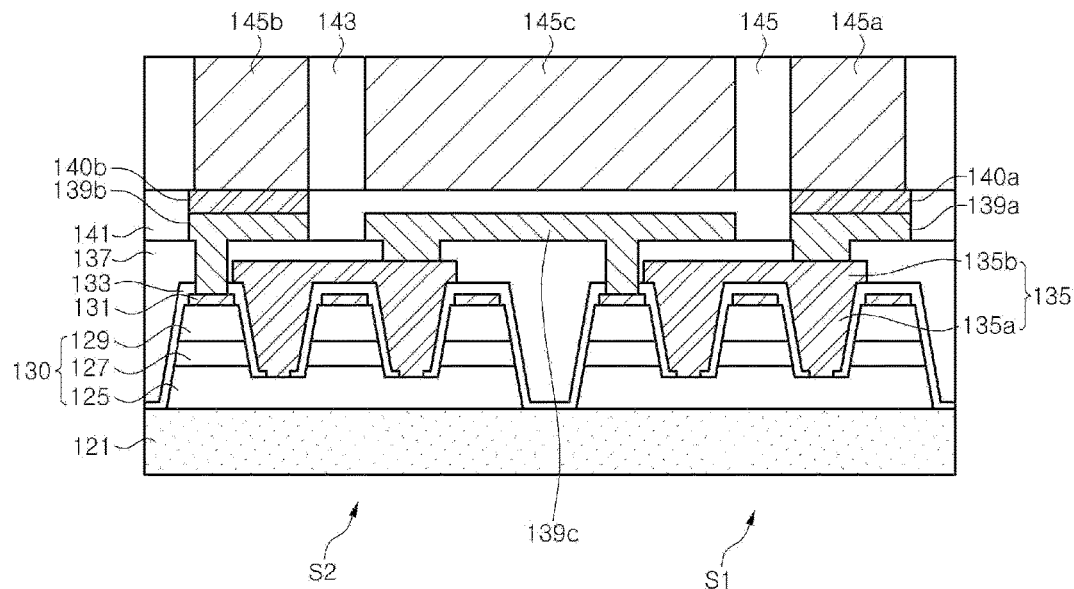

Referring to FIG. 26, the growth substrate 121 is removed and a wavelength convertor 151 is attached to the light emitting cells S1, S2. The growth substrate 21 may be removed by an optical technique such as laser lift-off (LLO), mechanical polishing or chemical etching.

Then, the exposed surface of the first conductive type semiconductor layer 125 is subjected to anisotropic etching such as PEC etching to form a roughened surface on the exposed first conductive type semiconductor layer 125.

Meanwhile, the wavelength convertor 151, such as a phosphor sheet containing phosphors, may be attached to the first conductive type semiconductor layer 125

Alternatively, the growth substrate 121 may contain an impurity for converting a wavelength of light generated in the active layer 127. In this case, the growth substrate 121 may be used as the wavelength convertor 151.

Then, the LED package structure is divided into individual packages along the chip separation region 130c, thereby providing finished LED packages 300. At this time, the second insulation layer 137 is cut together with the wavelength convertor 151 so that cut planes thereof can be formed in a line.

Figure 27:
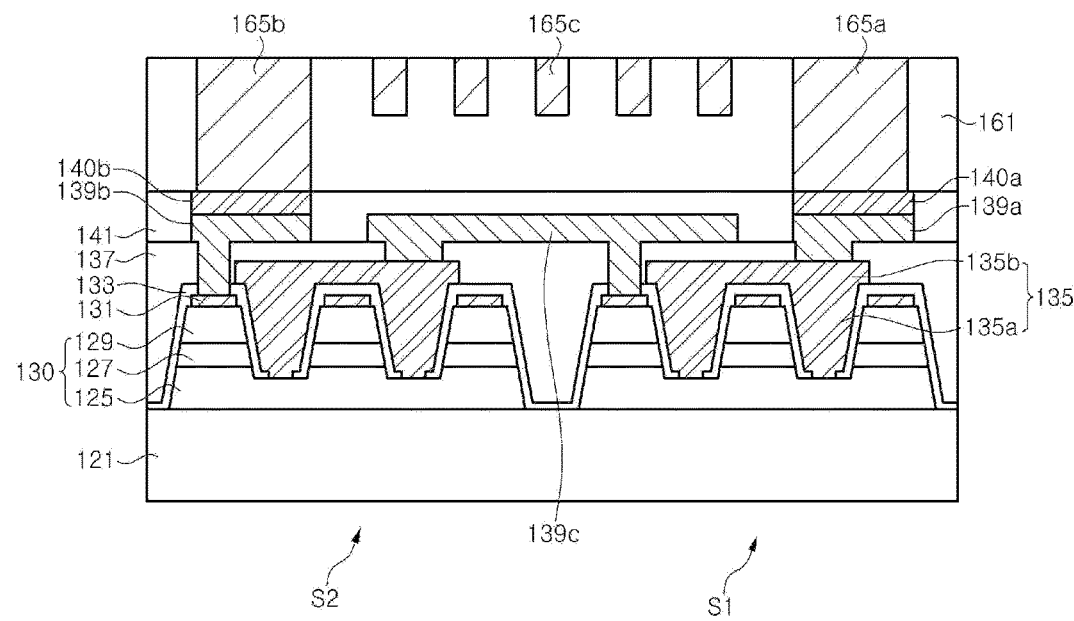
FIG. 27 is a sectional view showing a method of fabricating the light emitting diode package according to the fourth exemplary embodiment of the invention.

FIG. 27 is a sectional view explaining a method of fabricating the LED package 400 according to the fourth exemplary embodiment of the invention.

Referring to FIG. 27, in the method of fabricating the LED package 400 according to this embodiment, the processes until the third insulation layer 141 and the additional metal layers 140a, 1140b are formed are the same as those of the method of fabricating the LED package 300 described above (FIG. 24).

In the present exemplary embodiment, the substrate 161 is bonded to the third insulation layer 141. The substrate 161 may have through-holes, in which the first and second bumps 165a, 165b may be formed. Further, the first and second bumps 165a, 165b may be formed at distal ends thereof with pads (not shown). In addition, the substrate 161 may have grooves partially formed on a lower surface thereof and filled with a metallic material 165c. The metallic material 165c improves substrate heat dissipation.

Alternatively, the substrate 161 having the first and second bumps 165a, 165b may be separately prepared and bonded to a wafer having the first and second electrode pads 139a, 139b. The first and second bumps 165a, 165b may be electrically connected to first and second electrode pads 139a, 139b, respectively.

Then, as described with reference to FIG. 26, the growth substrate 121 is removed and the wavelength convertor 151 may be attached to the light emitting cells S1, S2, followed by division of the LED package structure into individual LED packages. As a result, the finished LED packages 400 as described in FIG. 15 are provided.

As such, the exemplary embodiments of the invention provide wafer-level LED packages which can be directly formed on a circuit board for a module without using a conventional lead frame or printed circuit board. Accordingly, the LED package may have high efficiency and exhibit improved heat dissipation while reducing time and cost for fabrication of the LED package. In addition, an LED module having the LED package mounted thereon may have high efficiency and exhibit improved heat dissipation.

Further, the LED package may include a plurality of light emitting cells connected in series to each other and arrays connected in reverse parallel to each other. Further, the plurality of light emitting cells may be connected to a bridge rectifier and may be used to form a bridge rectifier. Therefore, the LED module including the LED package may be operated by AC power without a separate AC/DC converter.

Although the invention has been illustrated with reference to some exemplary embodiments in conjunction with the drawings, it will be apparent to those skilled in the art that various modifications and changes can be made to the invention without departing from the spirit and scope of the invention. Further, it should be understood that some features of a certain embodiment may also be applied to other embodiment without departing from the spirit and scope of the invention. Therefore, it should be understood that the embodiments are provided by way of illustration only and are given to provide complete disclosure of the invention and to provide thorough understanding of the invention to those skilled in the art. Thus, it is intended that the invention covers the modifications and variations provided they fall within the scope of the appended claims and their equivalents.

What is claimed is:

1. A light emitting diode (LED) package comprising one or more light emitting diodes to emit light, wherein each single light emitting diode includes:

a semiconductor stack including a first conductive type semiconductor layer and a mesa structure including a second conductive type semiconductor layer and an active layer interposed between the first and second conductive type semiconductor layers to generate light under an electrical current applied to the first and second conductive type semiconductor layers;

a first insulation layer structured to cover the semiconductor stack and to expose the first conductive type semiconductor;

a first electrode electrically connected to the first conductive type semiconductor layer exposed by the first insulation layer;

a second electrode disposed over the second conductive type semiconductor layer and electrically connected to the second conductive type semiconductor layer;

a second insulation layer disposed over the first electrode and the second electrode structured to expose a part of the first electrode and a part of the second electrode;

a second electrical contact layer disposed over the first insulation layer and electrically connected to a part of the second conductive type semiconductor layer exposed by the first insulation layer;

a first electrically conductive pad disposed on the first electrode layer to conduct the electrical current through the first conductive type semiconductor layer and including a portion located over the first electrode; and a second electrically conductive pad disposed on the second electrode layer to conduct the electrical current through the second conductive type semiconductor layer and including a portion located over the first electrode.

2. The LED package of claim 1, wherein the first electrode includes a portion extending along the first conductive type semiconductor layer.

3. The LED package of claim 2, wherein the portion of the first electrode is disposed under the first electrically conductive pad and the second electrically conductive pad.

4. The LED package of claim 2, further comprising an additional semiconductor stack disposed adjacent to the semiconductor stack and electrically connected in series to the semiconductor stack through the portion of the first electrode of the semiconductor stack.

5. The LED package of claim 2, wherein the first insulation layer further comprising a portion having a varying thickness along the semiconductor stack.

6. The LED package of claim 2, wherein the portion of the first electrode comprises a same material as the second electrical contact layer.

7. The LED package of claim 1, wherein the first electrode further comprises a first electrical contact layer that covers the first insulation layer and is electrically connected to the first conductive type semiconductor layer exposed by the first insulation layer.

8. The LED package of claim 1, further comprising:
a first substrate located on a first side of the semiconductor stack, over which the semiconductor stack, the first and second electrodes, the first and second insulation layers, the first and second electrical contact layers, and the first and second electrically conductive pads are disposed;
a second substrate located on a second opposite side to the first side of the semiconductor stack, the second substrate including circuitry for supplying the electrical current to the semiconductor stack.

9. The LED package of claim 1, further comprising:
a wavelength converter located on an opposite side of the first conductive type semiconductor layer to the semiconductor stack and including a phosphor composition that converts light emitted from the active layer into a light at a different wavelength.

10. The LED package of claim 9, wherein the wavelength converter includes a first sidewall and a second sidewall that are externally facing sidewalls of the light emitting diode, and the second insulation layer has outer side walls aligned with the first sidewall and the second sidewall of the wavelength converter.

11. The LED package of claim 1, further comprising:
a substrate including a first sidewall and a second sidewall that are externally facing sidewalls of the light emitting diode and including a first surface and a second opposite surface, the semiconductor stack disposed over the second opposite surface, and
wherein the second insulation layer has outer sidewalls aligned with the first sidewall and the second sidewall of the substrate.

12. The LED package of claim 1, wherein the LED package is structured such that the electrical current passes through the second electrically conductive pad, the second electrical contact layer, and the second electrode, and the second conductive type semiconductor layer.

13. The LED package of claim 1, wherein the LED package is structured such that the electrical current passes through the first electrically conductive pad, the first electrode, and the first conductive type semiconductor layer.

14. The LED package of claim 1, wherein the first electrode is located between the first insulation layer and the second insulation layer.

15. The LED package of claim 1, wherein the second insulation layer includes a portion that is disposed on a sidewall of the semiconductor stack that is an externally facing sidewall of the light emitting diode.

16. The LED package of claim 15, wherein the portion of the second insulation layer has a varying thickness along the sidewall of the semiconductor stack.

17. The LED package of claim 1, wherein the semiconductor stack and the first insulation layer have inclined sidewalls.

18. The LED package of claim 1, further comprising:
a dummy bump that includes electrically conductive material and is arranged between the first and second electrically conductive pads, the dummy bump structured to dissipate heat from the LED device and electrically insulated from the first and second electrically conductive pads.

19. An LED package device comprising:
a light emitting structure formed over a substrate and patterned to include a first light emitting structure and a second light emitting structure disposed apart from the first light emitting structure by a cell separation region, each of the first light emitting structure and the second light emitting structure including a first conductivity type semiconductor layer, a second conductivity type semiconductor layer, and an active layer interposed between the first conductivity type semiconductor layer and the second conductivity type semiconductor layer and structured to generate light under an electrical signal applied to the first and second conductive type semiconductor layers;
a first electrode pad disposed over the first light emitting structure and electrically connected to the first conductivity type semiconductor layer of the first light emitting structure;
a second electrode pad disposed over the second light emitting structure and electrically connected to the second conductivity type semiconductor layer of the second light emitting structure; and
a connector disposed over the cell separation region and extending over the first light emitting structure and the second light emitting structure, the connector structured to electrically couple the first light emitting structure with the second light emitting structure, and
wherein the first electrode pad, the second electrode pad, and the connector occupy more than one half of a planar area of the substrate.

20. The LED package device of claim 19, wherein the connector has a dimension greater than a dimension of both the first electrode pad and the second electrode pad.

21. The LED package device of claim 19, further comprising:
an insulation structure formed to surround the first light emitting structure and the second light emitting structure and including openings, and
wherein each of the first electrode pad and the second electrode pad fills one of the openings of the insulation structure and the connector fills two of the openings of the insulation structure.

22. The LED package device of claim 19, wherein the connector is located between the first electrode pad and the second electrode pad along a direction parallel to a surface of the substrate.

23. The LED package device of claim 19, further comprising contact holes located in each of the first light emitting structure and the second light emitting structure and surrounded by the second conductivity type semiconductor layer and the active layer to pass therethrough so as to expose the first conductivity type semiconductor layer.

24. The LED package device of claim 23, wherein each of the first light emitting structure and the second light emitting structure comprises:
   a first contact layer filling in the contact holes to be electrically coupled to the first conductive type semiconductor layer;
   a second contact layer disposed over the second conductivity type semiconductor layer.

25. The LED package device of claim 24, further comprising:
   an insulation structure formed to surround and protect the first light emitting structure and the second light emitting structure and including first openings exposing the first contact layer of the first light emitting structure or the second light emitting structure and second openings exposing the second contact layer of the first light emitting structure or the second light emitting structure.

26. The LED package device of claim 25,
   wherein the connector fills in the first opening exposing the first contact layer of the first light emitting structure and fills in the second opening exposing the second contact layer of the second light emitting structure.

27. The LED package device of claim 25,
   wherein the first electrode pad fills in the first opening exposing the first contact layer of the second light emitting structure and the second electrode pad fills in the second opening exposing the second contact layer of the first light emitting structure.

28. A light emitting diode (LED) package, comprising one or more light emitting diodes to emit light, wherein each single light emitting diode includes:
   a semiconductor stack comprising a first conductive type semiconductor layer, an active layer, and a second conductive type semiconductor layer;
   means for exposing the first conductive type semiconductor layer through the second conductive type semiconductor layer and the active layer;
   a first bump arranged on a first side of the semiconductor stack, the first bump being electrically connected to an exposed part of the first conductive type semiconductor layer; and
   a second bump arranged on the first side of the semiconductor stack, the second bump being electrically connected to the second conductive type semiconductor layer; and
   wherein the LED package further includes a protective insulation layer covering each external side wall surface of the semiconductor stack facing externally of the LED package so that the protection insulation layer surrounds the LED package.

29. The LED package of claim 28, further comprising means for converting light at a first wavelength emitted by the semiconductor stack on a second side of the semiconductor stack into light of a different wavelength.

30. The LED package of claim 28, further comprising:
   a first contact layer comprising first contact sections contacting exposed parts of the first conductive type semiconductor layer and a connecting section connecting the first contact sections; and
   a second contact layer contacting the second conductive type semiconductor layer,
   wherein the protective insulation layer comprises a first insulation layer and a second insulation layer, the first insulation layer being arranged between the first contact layer and the second contact layer and covering the second contact layer, and the second insulation layer being arranged between the semiconductor stack and the first contact layer and covering the first contact layer,
   wherein the first bump is electrically connected to the first contact layer, and the second bump is electrically connected to the second contact layer.

31. The LED package of claim 30, further comprising:
   a first electrode pad contacting the first contact layer through a first contact hole arranged in the second insulation layer; and
   a second electrode pad contacting the second contact layer though a second contact hole arranged in the second insulation layer and the first insulation layer,
   wherein the first bump and the second bump contact the first electrode pad and the second electrode pad, respectively.

32. The LED package of claim 30, wherein at least one of the first insulation layer and the second insulation layer comprises a distributed Bragg reflector.

33. A structure having light emitting diode (LED) packages, comprising:
   a stack of layers formed over one another and patterned to include an array of LED package regions, each LED package region including (1) a LED package formed in the stack of layers in a central region of the LED package region and (2) a protective insulation structure formed to surround and protect the LED package from surroundings outside the protective insulation structure and to separate from adjacent LED packages,
   wherein each LED package formed in the stack of layers includes:
      a semiconductor stack including a first conductive type semiconductor layer, a second conductive type semiconductor layer and an active layer between the first and second semiconductor layers to generate light under an electrical signal applied to the first and second type semiconductor layers, wherein the semiconductor stack is located between a first side and a second side of the semiconductor stack that are on opposite sides of the semiconductor stack;
      means in each semiconductor stack for exposing the first conductive type semiconductor layer through the second conductive type semiconductor layer and the active layer;
      a first electrical contact layer material electrically coupled to an exposed part of the first conductive type semiconductor layer;
      a first bump on the first side of the semiconductor stack and electrically coupled to the first conductive type semiconductor layer via the first electrical contact layer material; and
      a second bump on the first side of the semiconductor stack and electrically insulated from the first bump to be electrically coupled to the second conductive type semiconductor layer, and
   wherein the protective insulation structure includes a two-layer protective structure having a first protective insulation layer that surrounds and covers each external side wall surface of the semiconductor stack and a second protective insulation layer that forms on the first protective insulation layer to protect the semiconductor stack from an external environment.

34. The structure as in claim 33, comprising a wafer on which the stack of layers is formed and is patterned to include the array of LED package regions.

35. The structure as in claim 33, wherein:
the protective insulation structure further covers an entirety of each external side surface of an electrical contact structure that includes the first and second bumps on the first side of the semiconductor stack to protect the electrical contact structure from an external environment.

36. The structure as in claim 33, wherein each LED package formed in the stack of layers includes:
an electrically conductive structure formed on the first side of the semiconductor stack between the first and second bumps to be electrically insulated from the first and second bumps to dissipate heat from the LED package.

37. A light emitting diode (LED) package, comprising:
a semiconductor stack comprising a first conductive type semiconductor layer, a second conductive type semiconductor layer and an active layer that is interposed between the first and second semiconductor layers to generate light under an electrical signal applied to the first and second type semiconductor layers, wherein the semiconductor stack is located between a first side and a second side of the semiconductor stack that are on opposite sides of the semiconductor stack, and wherein the first side is closer to the second conductive type semiconductor layer than the first conductive type semiconductor layer and the second side is closer to the first conductive type semiconductor layer than the second conductive type semiconductor layer;
means in the semiconductor stack for exposing the first conductive type semiconductor layer;
an electrical contact structure on the first side of the semiconductor stack and electrically coupled to supply the electrical signal to the first and second type semiconductor layers, the electrical contact structure including (1) a first bump formed of an electrically conductive material and arranged on the first side of the semiconductor stack and electrically coupled to the first conductive type semiconductor layer as part of a first electrical contact path to the semiconductor stack, (2) a first electrical contact layer material disposed to electrically couple the first conductive type semiconductor layer and the first bump, (3) a second bump formed of the electrically conductive material of the first bump and arranged on the first side of the semiconductor stack and electrically insulated from the first bump to be electrically coupled to the second conductive type semiconductor, and (4) a second electrical contact layer material electrically coupled between the second bump and the second conductive type semiconductor layer; and
an external structure that covers (1) the second side of the semiconductor stack that exports light generated in the active layer outside the LED package, and (2) side wall surfaces of the semiconductor stack.

38. The LED package as in claim 37, wherein the external structure includes:
a first stacked protective insulation structure positioned to cover the entirety of each external side wall surface of the semiconductor stack to protect the semiconductor stack from an external environment; and
a second stacked protective insulation structure stacked over the first stacked protective insulation structure and located on the first side of the semiconductor stack to cover an entirety of each external side surface of the electrical contact structure to protect the electrical contact structure from an external environment.

39. The LED package as in claim 37, wherein:
the external structure further covers external side wall surfaces of the electrical contact structure on the first side of the semiconductor stack.

40. The LED package as in claim 37, wherein the external structure includes:
a first protective insulation layer covering an entirety of each external side wall surface of the semiconductor stack; and
a second protective insulation layer that surrounds the semiconductor stack and forms on the first protective insulation layer so that the second protective insulation layer and the first protective insulation collectively form a two-layer protection structure to cover the entirety of each external side wall surface of the semiconductor stack and to enclose external sides of the semiconductor stack.

41. The LED package as in claim 40, wherein the second protective insulation structure includes a phosphor structure that coverts light emitted from the active layer into light at a different wavelength to be exported on the second side out of the LED package.

42. The LED package as in claim 37, further comprising:
an electrically conductive material on the first side of the semiconductor stack near the first bump or second bump to dissipate heat from the LED package, wherein the electrically conductive material is not electrically connected to the first bump or the second bump.

* * * * *